(12) United States Patent
Li et al.

(10) Patent No.: US 12,213,241 B2
(45) Date of Patent: Jan. 28, 2025

(54) APPARATUS, SYSTEM, AND METHOD FOR IMPLEMENTING MULTIPURPOSE SCREW HOLES IN CIRCUIT PACKAGING FOR MOBILE DEVICES

(71) Applicant: Meta Platforms Technologies, LLC, Menlo Park, CA (US)

(72) Inventors: Qiuming Li, Palo Alto, CA (US); Colden Niles Eldridge, Oakland, CA (US); Ming Lei, San Jose, CA (US); Yibo Liu, Richmond Hill (CA); Md Rashidul Islam, Fremont, CA (US); Sung Hoon Oh, San Jose, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 195 days.

(21) Appl. No.: 18/158,085

(22) Filed: Jan. 23, 2023

(65) Prior Publication Data

US 2024/0251499 A1 Jul. 25, 2024

(51) Int. Cl.
*H05K 1/02* (2006.01)
(52) U.S. Cl.
CPC ......... *H05K 1/0215* (2013.01); *H05K 1/0237* (2013.01); *H05K 1/0271* (2013.01); *H05K 2201/10098* (2013.01); *H05K 2201/10401* (2013.01); *H05K 2201/10409* (2013.01)

(58) Field of Classification Search
CPC .. H05K 1/0215; H05K 1/0237; H05K 1/0271; H05K 2201/10098; H05K 2201/10401; H05K 2201/10409
See application file for complete search history.

(56) References Cited

U.S. PATENT DOCUMENTS

| 6,501,945 | B1 * | 12/2002 | Chien | H04B 1/3833 455/296 |
| 2013/0257659 | A1 * | 10/2013 | Darnell | H05K 1/028 343/702 |
| 2021/0015008 | A1 * | 1/2021 | Ohkubo | H05K 5/0047 |
| 2023/0017402 | A1 * | 1/2023 | Ozaki | H05K 5/0026 |

FOREIGN PATENT DOCUMENTS

DE 112019000890 T5 10/2020

OTHER PUBLICATIONS

European Search Report for European Patent Application No. 23213160.7, dated May 21, 2024, 8 pages.

* cited by examiner

*Primary Examiner* — Sherman Ng
(74) *Attorney, Agent, or Firm* — Greenberg Traurig, LLP

(57) ABSTRACT

A circuit package may comprise (1) a substrate, (2) at least one radio frequency (RF) circuit disposed on the substrate, and (3) a plurality of screw holes that are incorporated into the substrate and configured to support mounting the substrate to an enclosure, wherein at least one of the screw holes is further configured to provide at least one supplemental function in connection with the RF circuit. Various other apparatuses, systems, and methods are also disclosed.

19 Claims, 15 Drawing Sheets

APPARATUS, SYSTEM, AND METHOD FOR IMPLEMENTING MULTIPURPOSE SCREW HOLES IN CIRCUIT PACKAGING FOR MOBILE DEVICES

BRIEF DESCRIPTION OF DRAWINGS

The accompanying Drawings illustrate a number of exemplary embodiments and are parts of the specification. Together with the following description, the Drawings demonstrate and explain various principles of the instant disclosure.

Figure 1:
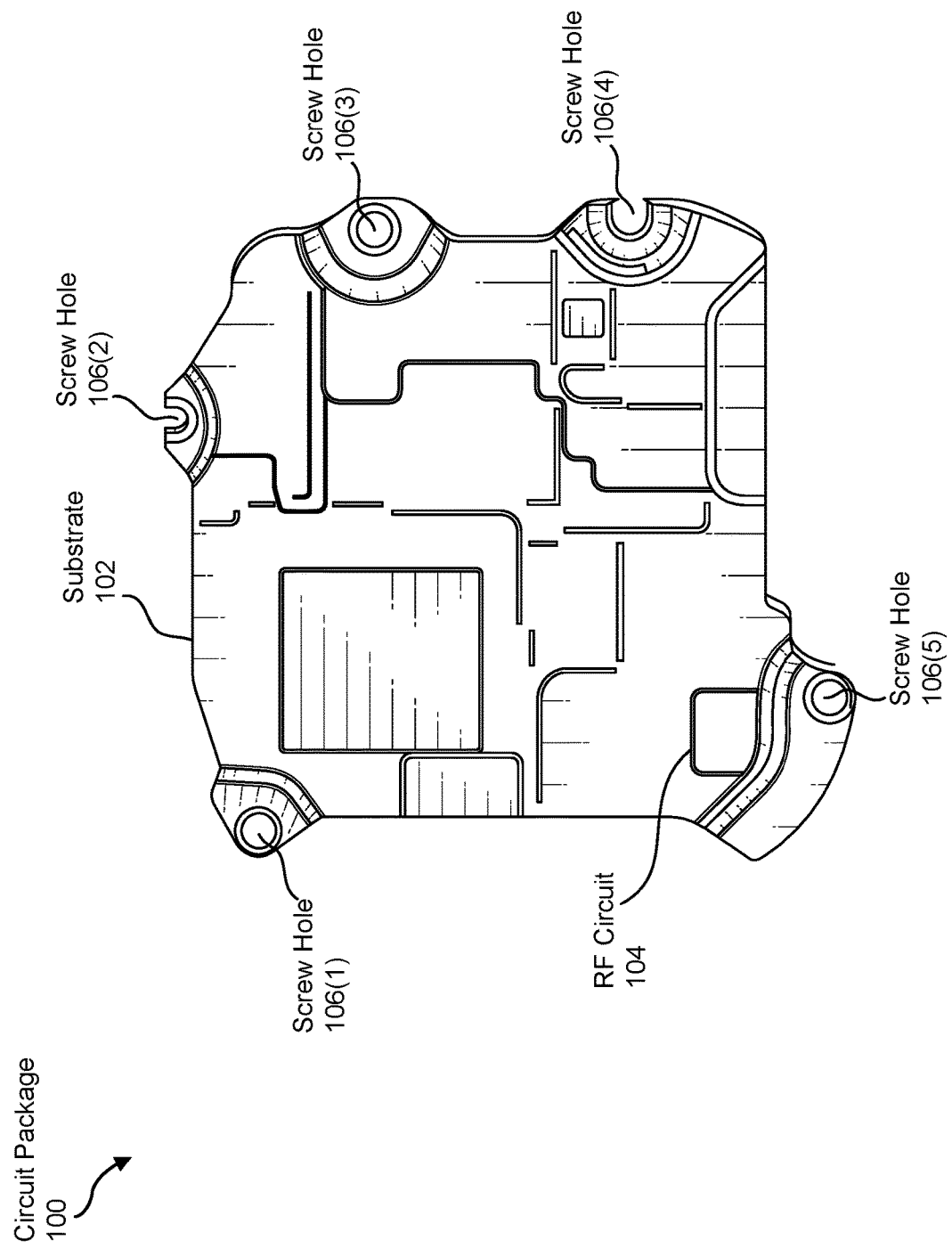
FIG. 1 is an illustration of an exemplary circuit package with multipurpose screw holes according to one or more embodiments of this disclosure.

While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, combinations, equivalents, and alternatives falling within this disclosure.

DETAILED DESCRIPTION

The present disclosure is generally directed to apparatuses, systems, and methods for implementing multipurpose screw holes in circuit packaging for mobile devices. As will be explained in greater detail below, these apparatuses, systems, and methods may provide numerous features and benefits.

In some examples, mobile devices may present certain challenges and/or design constraints that are less applicable and/or relative to larger devices and/or systems. For example, when designing a mobile device, engineers may want and/or need to fit various components in a small and/or tight enclosure for functional purposes. Additionally or alternatively, such engineers may want and/or need to ensure that the mobile device's design is robust enough to withstand and/or endure abrupt movements and/or forces.

Naturally, some features of a mobile device's design may consume space that could otherwise be allocated for use by other components. For example, a mobile device may include a circuit board that is secured to an enclosure by screws. To accommodate such screws, the circuit board may form and/or incorporate screw holes. Unfortunately, those screw holes may constitute and/or represent voids where no components are present and/or allowed. However, such screw holes may provide opportunities for additional uses that improve the design efficiency of mobile devices. The instant disclosure, therefore, identifies and addresses a need for additional apparatuses, systems, and methods for implementing multipurpose screw holes in circuit packaging for mobile devices.

In some examples, the various apparatuses, systems, and/or methods disclosed herein may be able to improve the design efficiency of mobile devices by implementing multipurpose screw holes in circuit packages, such as systems-in-packages (SIPs). For example, a mobile device may include a board-level system in package (SIP) that forms and/or incorporates various screw holes that serve as mounting points between the SIP and an enclosure. In one example, the clamping areas and/or keepout regions proximate to the SIP's screw holes may implement floating copper islands within internal planes and/or layers of the SIP. In this example, such floating copper islands may maintain board thickness and/or flatness near the SIP's screw holes as well as provide additional strength and/or stiffness to reinforce the SIP's structural integrity and/or robustness.

In another example, in addition to serving as mounting points between the SIP and the enclosure of the mobile device, the SIP's screw holes may also be used to electrically ground a radio frequency (RF) circuit disposed on the SIP to the enclosure. In this example, the SIP's screw holes may function as primary and/or secondary grounding paths between the RF circuit's ground node and the enclosure's ground node. In a further example, in addition to serving as mounting points between the SIP and the enclosure of the mobile device, the SIP's screw holes may also be used as antenna feeding points for the RF circuit's antenna structure. In this example, the SIP's screw holes may provide and/or support connections between antenna feeding points of the antenna structure and components (e.g., a radio and/or an antenna port) of the RF circuit via transmission lines.

As a supplementary example, in addition to serving as mounting points between the SIP and the enclosure of the mobile device, the SIP's screw holes may also be used as antenna tuning points for the RF circuit's antenna structure. In this example, the SIP's screw holes may provide and/or support connections between antenna tuner points of the antenna structure and antenna tuner ports of the RF circuit via transmission lines. By designing certain features of a SIP to utilize screw holes for purposes beyond mounting, engineers may be able to effectively consolidate space on the SIP, thereby potentially reducing the size of the SIP and/or the overall size of the mobile device. Additionally or alternatively, by designing floating copper islands into the SIP's clamping areas and/or keepout regions, engineers may be able to reinforce and/or bolster the SIP's structural integrity and/or robustness proximate to the screw holes.

The following will provide, with reference to FIGS. 1-9B, detailed descriptions of exemplary devices, systems, components, and corresponding configurations for implementing multipurpose screw holes in circuit packaging for mobile devices. In addition, detailed descriptions of methods for implementing multipurpose screw holes in circuit packaging for mobile devices in connection with FIG. 10. The discussion corresponding to FIGS. 11-15 will provide detailed descriptions of types of exemplary artificial-reality devices, wearables, and/or associated systems capable of implementing multipurpose screw holes in circuit packaging for mobile devices.

FIG. 1 illustrates a portion of an exemplary circuit package 100 that implements multipurpose screw holes in circuit packaging for mobile devices. In some examples, circuit package 100 may include and/or represent a substrate 102, an RF circuit 104, and/or screw holes 106(1)-(5). In one example, RF circuit 104 may be disposed on, incorporated into, and/or integrated into substrate 102. In this example, one or more of screw holes 106(1)-(5) may be configured to provide, support, and/or facilitate at least one supplemental function in addition to simply mounting circuit package 100 to an enclosure.

In some examples, the term "supplemental function", as used herein in connection with a screw hole, may refer to and/or represent any type or form of functionality of the screw hole that extends and/or expands its utility and/or purpose beyond simply mounting a circuit package to an enclosure. As a specific example of a supplemental function, one or more of screw holes 106(1)-(5) may provide, constitute, and/or facilitate a grounding feature that electrically couples an electrical ground of RF circuit 104 to an electrical ground of an enclosure (not necessarily illustrated in FIG. 1). As another example of a supplemental function, one or more of screw holes 106(1)-(5) may provide, constitute, and/or facilitate an antenna feeding point of an antenna structure incorporated into circuit package 100 and/or electrically coupled to RF circuit 104. In this example, the antenna feeding point at the screw hole may be electrically coupled to a component (e.g., a radio, a radio antenna port, an RF frontend antenna port, etc.) of RF circuit 104 via a transmission line (e.g., a stripline and/or a microstripline). In one example, this screw hole may be at least partially surrounded by a conductive ring that is electrically coupled to the antenna feeding point.

As an additional example of a supplemental function, one or more of screw holes 106(1)-(5) may provide, constitute, and/or facilitate an antenna tuning point of the antenna structure incorporated into circuit package 100 and/or electrically coupled to RF circuit 104. In this example, the antenna tuning point at the screw hole may be electrically coupled to an antenna tuner port of RF circuit 104 via a transmission line (e.g., a stripline and/or a microstripline). In one example, this screw hole may be at least partially surrounded by a conductive ring that is electrically coupled to the antenna tuning point. As a further example of a supplemental function, one or more of screw holes 106(1)-(5) may be positioned and/or formed within a reinforced clamping and/or keepout area of circuit package 100. In this example, the reinforced clamping and/or keepout area may include and/or represent isolated floating islands formed in an electrically conductive internal plane and/or layer of substrate 102 to strengthen the structural integrity and/or robustness of circuit package 100.

In some examples, substrate 102 may include and/or represent one or more circuit boards and/or electrical packages that facilitate carrying and/or transferring electric current and/or signals. In one example, each circuit board and/or electrical package in substrate 102 may include and/or represent one or more planes and/or layers through which electric current and/or signals are able to pass and/or traverse.

In some examples, substrate 102 may include and/or contain a variety of materials. Some of these materials may conduct electricity. Other materials included in substrate 102 may insulate certain conductive materials from one another.

In some examples, substrate 102 may include and/or incorporate various electrically conductive layers, such as ground layers, power layers, and/or signal layers. In one example, each electrically conductive layer may include and/or represent a plane of conductive material that is etched during the fabrication phase to produce various conductive paths and/or traces throughout substrate 102. In this example, the etched conductive paths and/or traces may be separated from and/or interconnected with one another as necessary to form one or more portions of a circuit that incorporate electrical components and/or electronics across substrate 102. Examples of such electrically conductive materials include, without limitation, copper, aluminum, silver, gold, alloys of one or more of the same, combinations or variations of one or more of the same, and/or any other suitable materials.

In some examples, the process of fabricating substrate 102 may be subtractive in nature (e.g., etching). In other examples, the process of fabricating substrate 102 may be additive in nature (e.g., modified semi-additive processing).

In some examples, substrate 102 may include and/or incorporate insulating material that facilitates mounting (e.g., mechanical support) and/or interconnection (e.g., electrical coupling) of electrical and/or electronic components. In one example, substrate 102 may include and/or represent one or more printed circuit boards (PCBs). Various components may be laminated, etched, attached, and/or otherwise coupled to substrate 102.

In some examples, substrate 102 may include and/or represent insulation material that electrically insulates different planes, layers, and/or signals from one another. In some examples, the insulation material may constitute and/or represent a dielectric substance that is a poor conductor of electricity and/or is polarized by an applied electric field. In one example, dielectric substances may be implemented as solids, liquids, and/or gases. Examples of dielectric substances include, without limitation, porcelains, glasses, plastics, industrial coatings, silicon, germanium, gallium arsenide, mica, metal oxides, silicon dioxides, sapphires, aluminum oxides, polymers, ceramics, variations or combinations of one or more of the same, and/or any other suitable dielectric substances.

In some examples, substrate 102 may be fabricated in any of a variety of ways, including sequential lamination. For example, as part of a sequential lamination process, substrate 102 may be fabricated layer by layer, using certain subcomposites of copper and insulating materials. In this example, the sequential lamination process may support and/or facilitate trace routing and/or via drilling within internal planes and/or layers.

In some examples, substrate 102 may form and/or represent an integrated circuit with various electrical contacts that facilitate electrical couplings. In one example, substrate 102 may constitute and/or form the base of a SIP that includes various integrated circuits. Additionally or alternatively, substrate 102 may be packaged and/or arranged in any other suitable form factor, including surface mount form factors, flat package form factors, small outline form factors, chip-scale form factors, quad row form factors, multi-chip form factors, combinations or variations of one or more of the same, and/or any other suitable form factors.

In some examples, RF circuit 104 may include and/or represent any type or form of circuit designed to produce, carry, transmit, receive, process, and/or otherwise use wireless signals within the radio frequency band and/or spectrum. In one example, RF circuit 104 may include and/or represent all or a portion of an integrated circuit, such as an RF integrated circuit (RFIC). Additionally or alternatively, RF circuit 104 may include and/or represent various components and/or devices that provide and/or facilitate one or more RF features. Examples of such components and/or devices include, without limitation, antennas, signal generators, filters, transmission lines, waveguides, radios, mixers, amplifiers, oscillators, couplers, detectors, combiners, receivers, transmitters, transceivers, tuners, modulators, demodulators, shielding, circuit boards, transistors, processors, resistors, capacitors, diodes, inductors, switches, registers, flipflops, connections, ports, antenna ports, RF frontends, portions of one or more of the same, combinations or variations of one or more of the same, and/or any other suitable components and/or devices.

In some examples, screw holes 106(1)-(5) may each constitute and/or represent any type or form void, opening, and/or hole fitted and/or sized to accept a screw. In one example, one or more of screw holes 106(1)-(5) may be threaded to secure a tight fit for and/or mate properly with a screw. In another example, one or more of screw holes 106(1)-(5) may be unthreaded to facilitate the passage of a screw to the corresponding receptacle in the enclosure. Either way, screw holes 106(1)-(5) may each form and/or take on the shape of a full circle, half circle, and/or partial circle. Additionally or alternatively, screw holes 106(1)-(5) may be positioned and/or configured to support and/or facilitate mounting circuit package 100 to an enclosure. Screw holes 106(1)-(5) may be formed and/or created in a variety of different ways, including drilling, counterboring, and/or countersinking, among others.

In some examples, circuit package 100 may include and/or represent any type or form of chip carrier and/or platform that integrates a variety of different components and/or integrated circuits into a single unit. In one example, circuit package 100 may include and/or represent a SIP that integrates and/or incorporates substrate 102, RF circuit 104, screw holes 106(1)-(5), and/or a variety of other components and/or integrated circuits (e.g., one or more processors, semiconductor devices, drivers, etc.). In this example, circuit package 100 may be mounted to an enclosure of a mobile device (e.g., a smartwatch, smartphone, wearable, etc.) configured for operation by a user.

Figure 2:
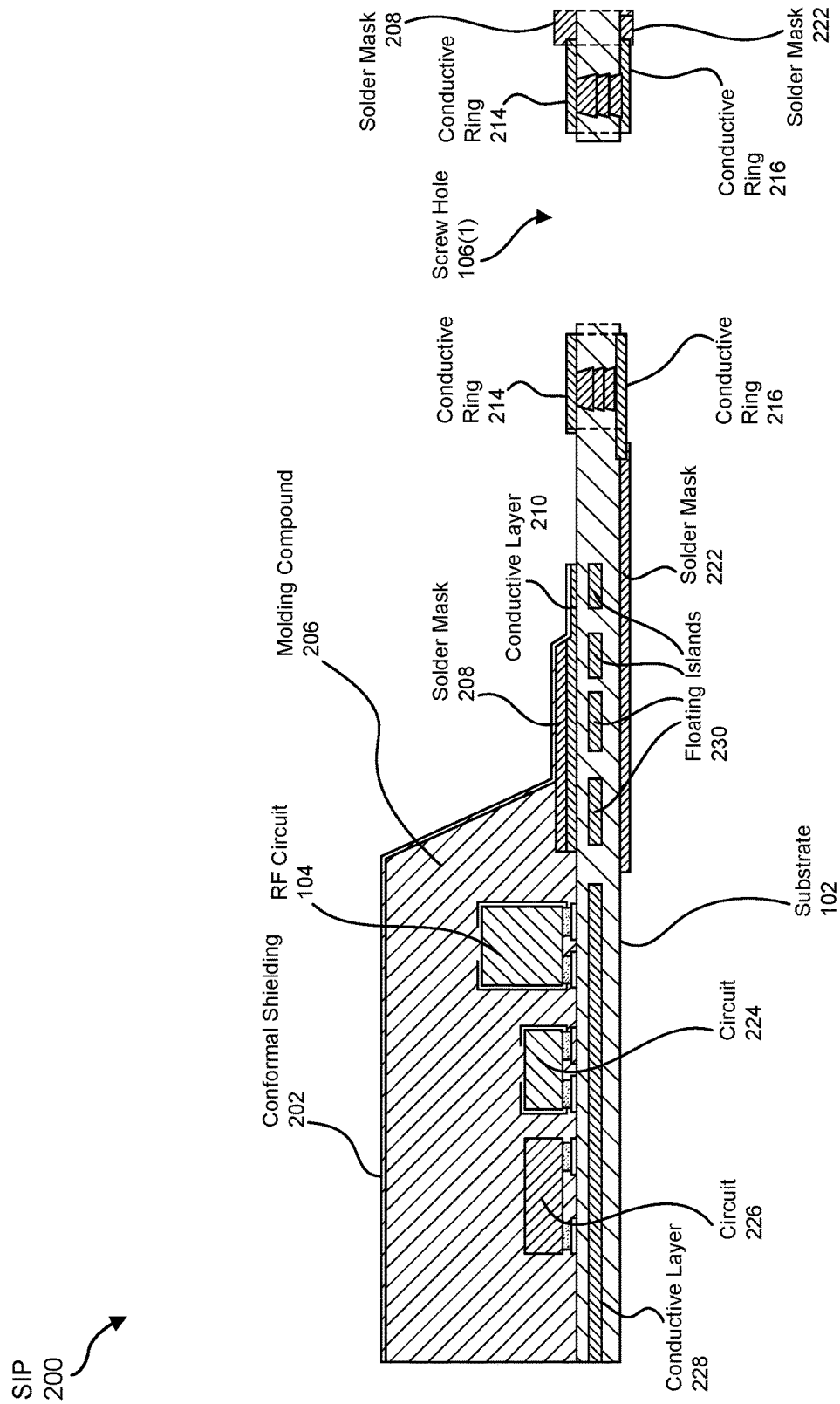
FIG. 2 is an illustration of an exemplary system-in-package (SIP) that implements multipurpose screw holes according to one or more embodiments of this disclosure.

FIG. 2 illustrates a portion of an exemplary SIP 200 that implements multipurpose screw holes for mounting to a mobile device enclosure. In some examples, SIP 200 may include and/or represent certain components, configurations, and/or features that perform and/or provide functionalities that are similar and/or identical to those described above in connection with FIG. 1. As illustrated in FIG. 2, exemplary SIP 200 may include and/or represent substrate 102, RF circuit 104, and/or screw hole 106(1). Additionally or alternatively, SIP 200 may include and/or represent circuits 224 and 226, a molding compound 206, a conformal shielding 202, solder masks 208 and 222, conductive layers 210 and 228, floating islands 230, and/or conductive rings 214 and 216. In one example, SIP 200 may also include and/or represent various other components, features, and/or screw holes that are not necessarily illustrated and/or labelled in FIG. 2.

In some examples, SIP 200 may form, integrate, and/or incorporate various floating islands 230 that provide additional strength and/or stiffness to the clamping area and/or keepout region surrounding and/or proximate to screw hole 106(1). In one example, floating islands 230 may each include and/or represent any type or form of isolated, internal segments and/or sections of an electrically conductive plane and/or layer within substrate 102. For example, floating islands 230 may each include and/or represent isolated pieces of copper that reside and/or are disposed between insulation material within substrate 102. In this example, floating islands 230 may maintain board thickness and/or flatness near screw hole 106(1) of SIP 200 to reinforce the structural integrity and/or robustness of SIP 200 near the clamping area and/or keepout region. In certain implementations, the keepout region may be reserved such that the antenna structure of RF circuit 104 is restricted and/or prevented from entering, residing in, and/or touching certain features of circuit package 100.

Although not necessarily presented this way in FIG. 2, any of screw holes 106(2)-(5) illustrated in FIG. 1 may implement, provide, and/or facilitate the same functionality described above in connection with screw hole 106(1) in FIG. 2. For example, any of screw holes 106(2)-(5) may form, integrate, and/or incorporate one or more floating islands that provide additional strength and/or stiffness to the clamping area and/or keepout region surrounding and/or proximate to such screw holes.

Figure 3:
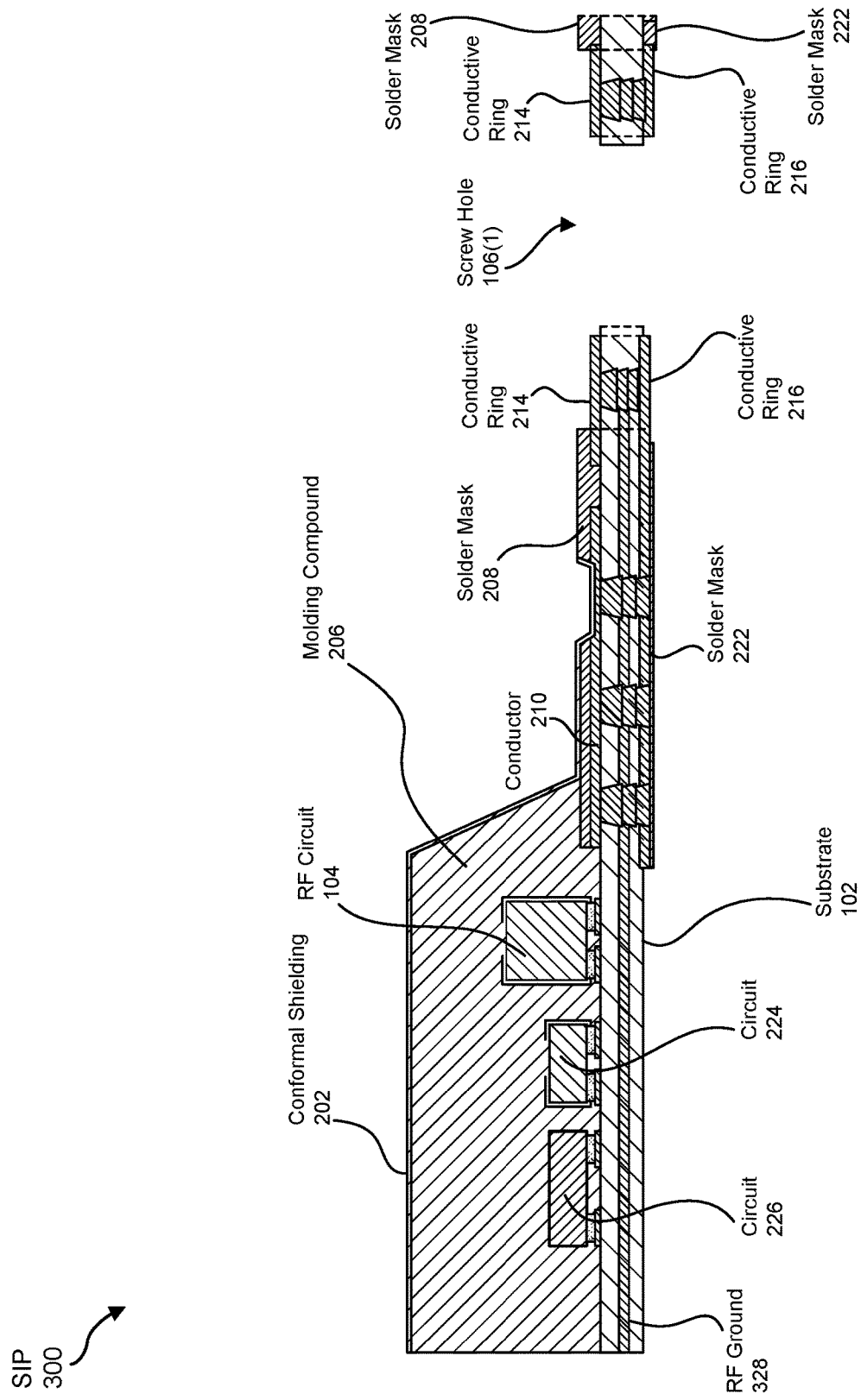
FIG. 3 is an illustration of an exemplary SIP that implements multipurpose screw holes according to one or more embodiments of this disclosure.

FIG. 3 illustrates a portion of an exemplary SIP 300 that implements multipurpose screw holes for mounting to a mobile device enclosure. In some examples, SIP 300 may include and/or represent certain components, configurations, and/or features that perform and/or provide functionalities that are similar and/or identical to those described above in connection with either of FIGS. 1 and 2. As illustrated in FIG. 3, exemplary SIP 300 may include and/or represent substrate 102, RF circuit 104, screw hole 106(1), circuits 224 and 226, molding compound 206, conformal shielding 202, solder masks 208 and 222, conductive layer 210, floating islands 230, and/or conductive rings 214 and 216. Additionally or alternatively, SIP 300 may include and/or represent an RF ground 328 of RF circuit 104. In one example, SIP 300 may also include and/or represent various other components, features, and/or screw holes that are not necessarily illustrated and/or labelled in FIG. 3.

In some examples, SIP 300 may include and/or implement an RF grounding feature that electrically couples RF ground 328 of RF circuit 104 to an electrical ground of a mobile device enclosure (not necessarily illustrated in FIG. 3) via screw hole 106(1). In one example, the RF grounding feature may include and/or represent conductive ring 214 and/or conductive ring 216, which each fully and/or partially surround screw hole 106(1) on a surface of SIP 300. In this example, screw hole 106(1) may be plated with conductive material, and conductive ring 214 and/or conductive ring 216 may be electrically coupled to RF ground 328 of RF circuit 104 via screw hole 106(1). Additionally or alternatively, conductive ring 214 and/or conductive ring 216 may be disposed and/or placed on a surface (e.g., an outer layer) of substrate 102 that makes contact with the electrical ground of the mobile device enclosure.

In one example, conductive ring 216 may be disposed and/or placed on the bottom surface of substrate 102, which makes direct physical contact with the electrical ground of the mobile device enclosure. In this example, conductive ring 214 may be disposed and/or placed on the top surface of substrate 102, which makes direct physical contact with the head of a screw inserted into screw hole 106(1). This screw may at least partially secure and/or couple substrate 102 and/or SIP 300 to the mobile device enclosure. Additionally or alternatively, this screw may provide, establish, and/or facilitate electrical continuity between conductive ring 214 and the electrical ground of the mobile device enclosure.

In some examples, any exposed conductive layers on an outer surface of substrate 102 may be covered and/or enshrouded by a solder mask (e.g., solder mask 208 or 222). In one example, the primary grounding path of the RF grounding feature may include and/or represent conductive ring 216 disposed on the bottom surface of substrate 102. In this example, the secondary grounding path of the RF grounding feature may include and/or represent conductive ring 214 disposed on the top surface of substrate 102, which makes contact with the head of the screw inserted into screw hole 106(1).

Although not necessarily presented this way in FIG. 3, any of screw holes 106(2)-(5) illustrated in FIG. 1 may implement, provide, and/or facilitate the same functionality described above in connection with screw hole 106(1) in FIG. 3. For example, any of screw holes 106(2)-(5) may form, integrate, and/or incorporate an RF grounding feature that electrically couples RF ground 328 of RF circuit 104 to an electrical ground of a mobile device enclosure.

Figure 4:
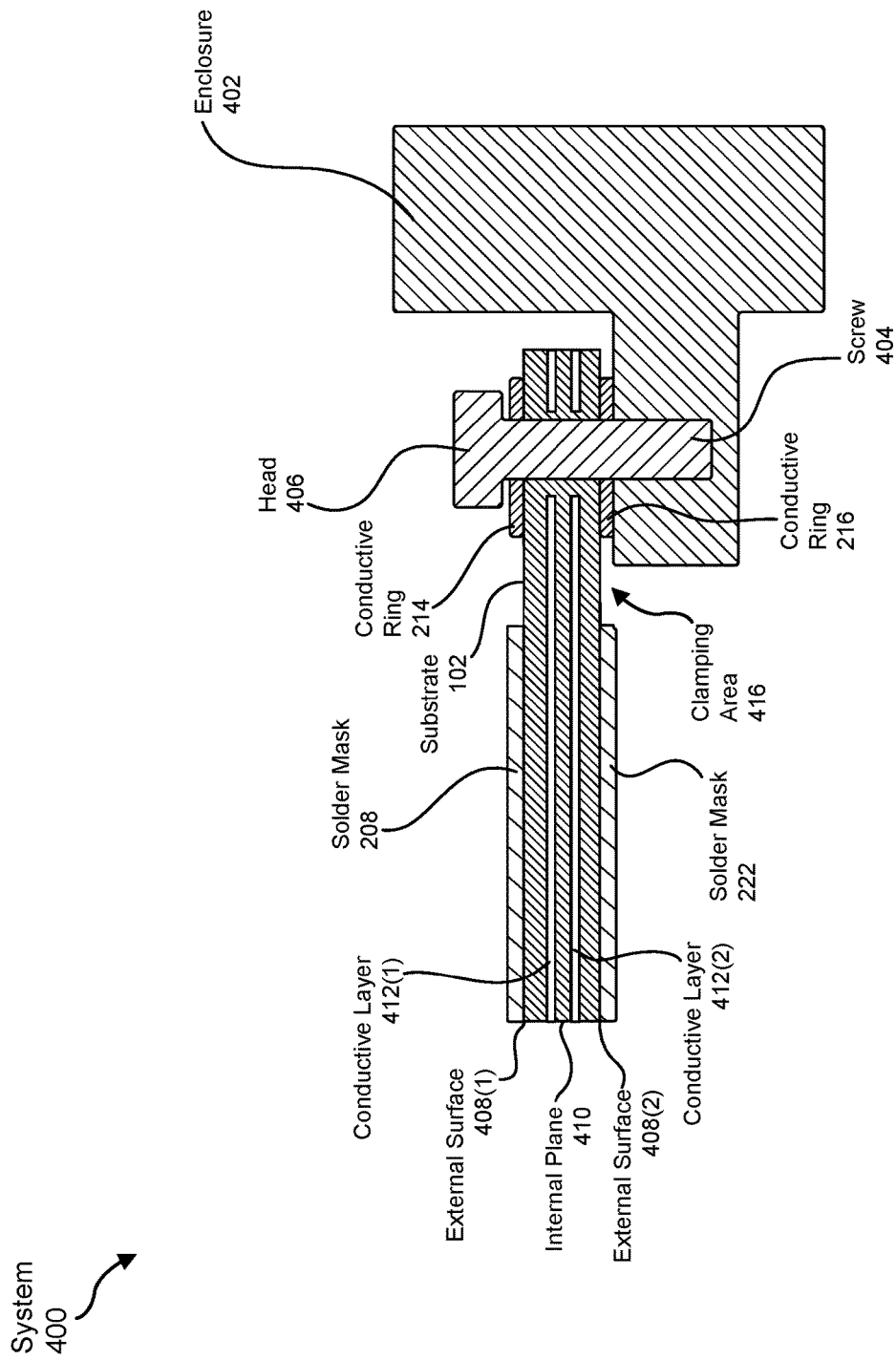
FIG. 4 is an illustration of an exemplary system that includes a circuit package with multipurpose screw holes according to one or more embodiments of this disclosure.

FIG. 4 illustrates a portion of an exemplary system 400 that implements multipurpose screw holes for mounting to a mobile device enclosure. In some examples, system 400 may include and/or represent certain components, configurations, and/or features that perform and/or provide functionalities that are similar and/or identical to those described above in connection with any of FIGS. 1-3. As illustrated in FIG. 4, exemplary system 400 may include and/or represent substrate 102 mounted, secured, and/or coupled to an enclosure 402 of a mobile device by a screw 404. In one example, screw 404 may be inserted and/or pass through one of screw holes 106(1)-(5) on substrate 102 to reach and/or mate with a receptacle on enclosure 402.

In some examples, substrate 102 may include and/or represent a clamping area 416 around and/or proximate to the screw hole where substrate 102 and enclosure 402 interface and/or contact one another via conductive ring 216. In one example, screw 404 may include and/or represent a head 406 that makes contact with conductive ring 214 at clamping area 416. In certain implementations, substrate 102 may include and/or represent conductive layers 412(1) and 412(2) that are separated from one another by an internal place 410. In one implementation, one or more of conductive layers 412(1) and 412(2) may be disposed and/or coupled to internal plane 410.

In some examples, conductive layer 412(1) may reside and/or be positioned between internal plane 410 and an external surface 408(1) of substrate 102. In such examples, conductive layer 412(2) may reside and/or be positioned between internal plane 410 and an external surface 408(2) of substrate 102. In one example, one or more floating islands may be formed and/or created in conductive layer 412(1) and/or conductive layer 412(2) at or near clamping area 416.

In some examples, external surfaces 408(1) and 408(2) may be initially fitted and/or equipped with conductive planes, layers, and/or material. In one example, such conductive planes, layers, and/or material may be fully or partially removed from external surface 408(1) and/or external surface 408(2) at or near clamping area 416.

Figure 5:
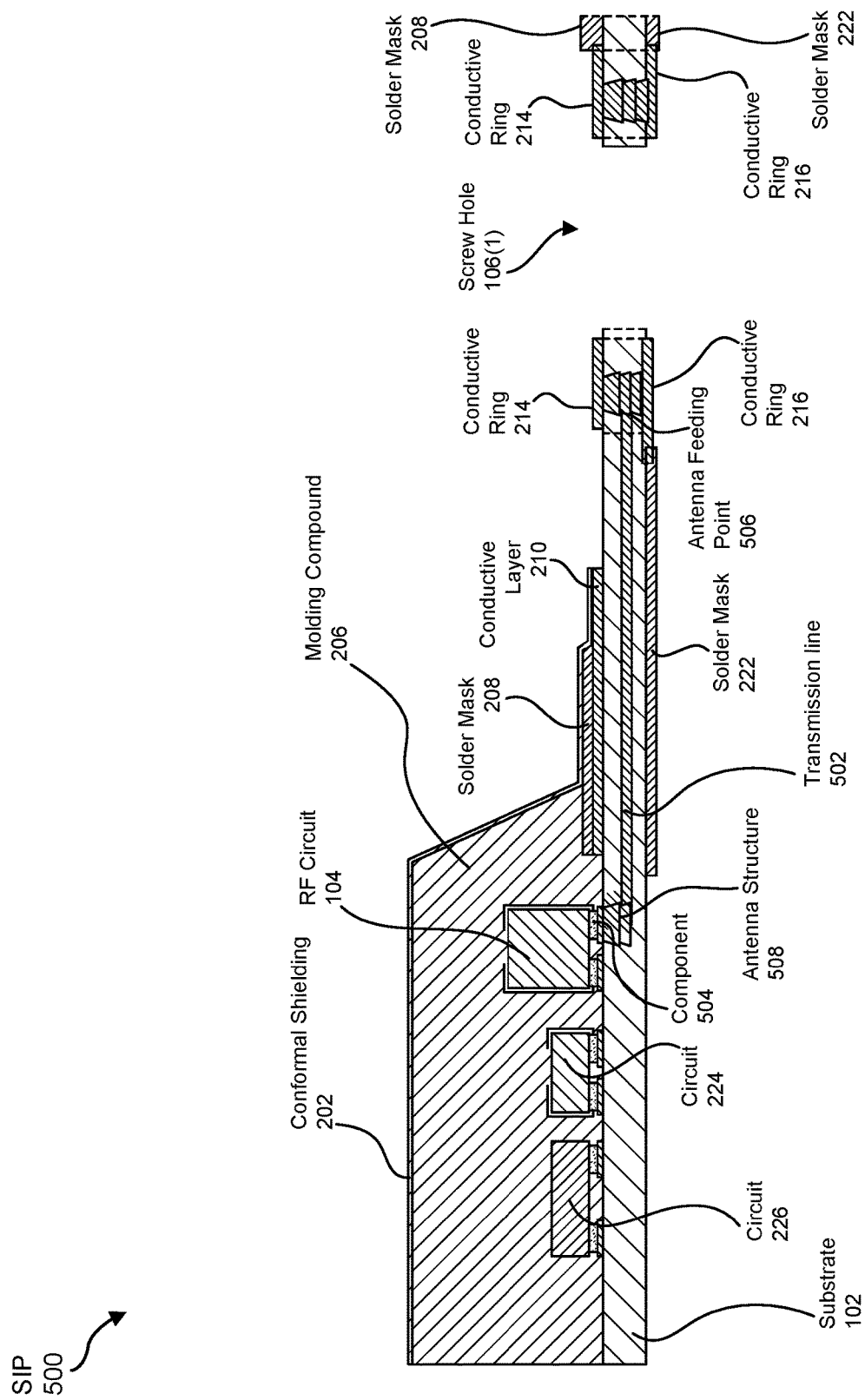
FIG. 5 is an illustration of an exemplary SIP that implements multipurpose screw holes according to one or more embodiments of this disclosure.

FIG. 5 illustrates a portion of an exemplary SIP 500 that implements multipurpose screw holes for mounting to a mobile device enclosure. In some examples, SIP 500 may include and/or represent certain components, configurations, and/or features that perform and/or provide functionalities that are similar and/or identical to those described above in connection with any of FIGS. 1-4. As illustrated in FIG. 5, exemplary SIP 500 may include and/or represent substrate 102, RF circuit 104, screw hole 106(1), circuits 224 and 226, molding compound 206, conformal shielding 202, solder masks 208 and 222, conductive layer 210, and/or conductive rings 214 and 216. Additionally or alternatively, SIP 500 may include and/or represent an antenna structure 508 electrically coupled to RF circuit 104. In one example, SIP 500 may also include and/or represent various other components, features, and/or screw holes that are not necessarily illustrated and/or labelled in FIG. 5.

In some examples, SIP 500 may include and/or implement an antenna feeding point 506 of antenna structure 508 that is electrically coupled to a component 504 of RF circuit 104 via a transmission line 502. For example, antenna feeding point 506 may include and/or represent the connection (e.g., realized by a screw contact) that links an RF circuit antenna terminal to the actual feed point of antenna structure 508. In this example, the connection may include and/or represent the location and/or place where RF energy is fed to the radiating structure. In one example, component 504 may include and/or represent a radio, a radio antenna port, and/or an RF frontend antenna port. Additionally or alternatively, antenna feeding point 506 may be formed and/or implemented at, by, and/or as screw hole 106(1). In this example, conductive ring 214 and/or conductive ring 216 may be electrically coupled to antenna feeding point 506. In certain embodiments, transmission line 502 may include and/or represent a stripline and/or a microstripline.

Although not necessarily presented this way in FIG. 5, any of screw holes 106(2)-(5) illustrated in FIG. 1 may implement, provide, and/or facilitate the same functionality described above in connection with screw hole 106(1) in FIG. 5. For example, any of screw holes 106(2)-(5) may form, integrate, and/or implement an antenna feeding point that is electrically coupled to a component of RF circuit 104 via a transmission line.

Figure 6:
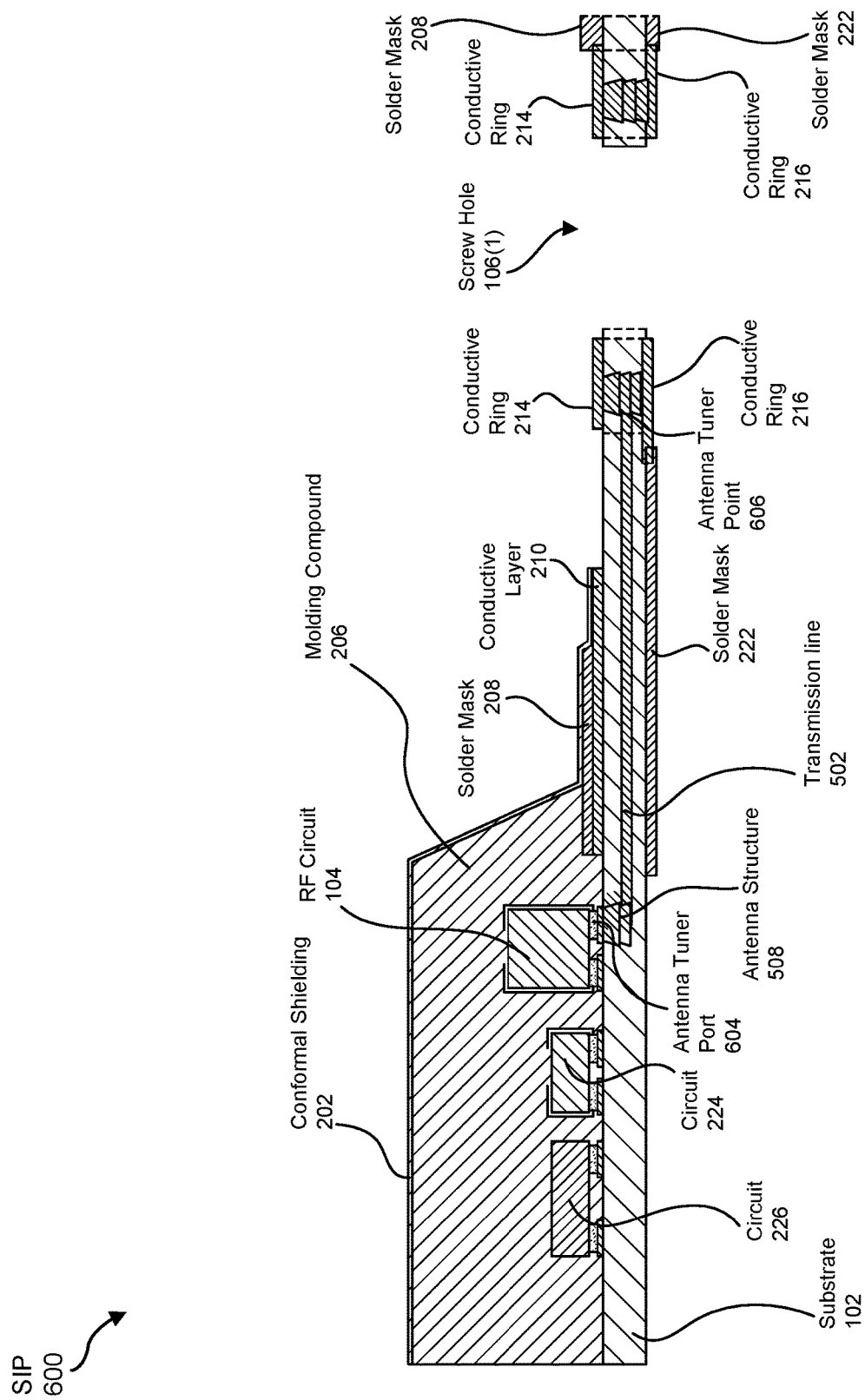
FIG. 6 is an illustration of an exemplary SIP that implements multipurpose screw holes according to one or more embodiments of this disclosure.

FIG. 6 illustrates a portion of an exemplary SIP 600 that implements multipurpose screw holes for mounting to a mobile device enclosure. In some examples, SIP 600 may include and/or represent certain components, configurations, and/or features that perform and/or provide functionalities that are similar and/or identical to those described above in connection with any of FIGS. 1-5. As illustrated in FIG. 6, exemplary SIP 600 may include and/or represent substrate 102, RF circuit 104, screw hole 106(1), circuits 224 and 226, molding compound 206, conformal shielding 202, solder masks 208 and 222, conductive layer 210, and/or conductive rings 214 and 216. Additionally or alternatively, SIP 600 may include and/or represent antenna structure 508 electrically coupled to RF circuit 104. In one example, SIP 600 may also include and/or represent various other components, features, and/or screw holes that are not necessarily illustrated and/or labelled in FIG. 6.

In some examples, SIP 600 may include and/or implement an antenna tuner point 606 of antenna structure 508 that is electrically coupled to an antenna tuner port 604 of RF circuit 104 via a transmission line 502. For example, antenna tuner point 606 may include and/or represent the connection (e.g., realized by a screw contact) that links an antenna tuner RF circuit terminal to the actual antenna tuning point of antenna structure 508. In this example, antenna tuner port 604 may include and/or represent a switchable conductive contact (e.g., switching between open and closed circuit) from RF circuit 104 to the antenna structure. The switching may facilitate tuning the resonant frequency of the antenna structure, as determined by the distance between the antenna tuner port and/or the feeding point or antenna tuning point, to match the antenna's frequency band of interest. In one example, antenna tuner point 606 may be formed and/or implemented at, by, and/or as screw hole 106(1). In this example, conductive ring 214 and/or conductive ring 216 may be electrically coupled to antenna tuner point 606. In certain embodiments, transmission line 502 may include and/or represent a stripline and/or a microstripline.

Although not necessarily presented this way in FIG. 6, any of screw holes 106(2)-(5) illustrated in FIG. 1 may implement, provide, and/or facilitate the same functionality described above in connection with screw hole 106(1) in FIG. 6. For example, any of screw holes 106(2)-(5) may form, integrate, and/or implement an antenna tuner point that is electrically coupled to antenna tuner port 604 via a transmission line.

Figure 7:
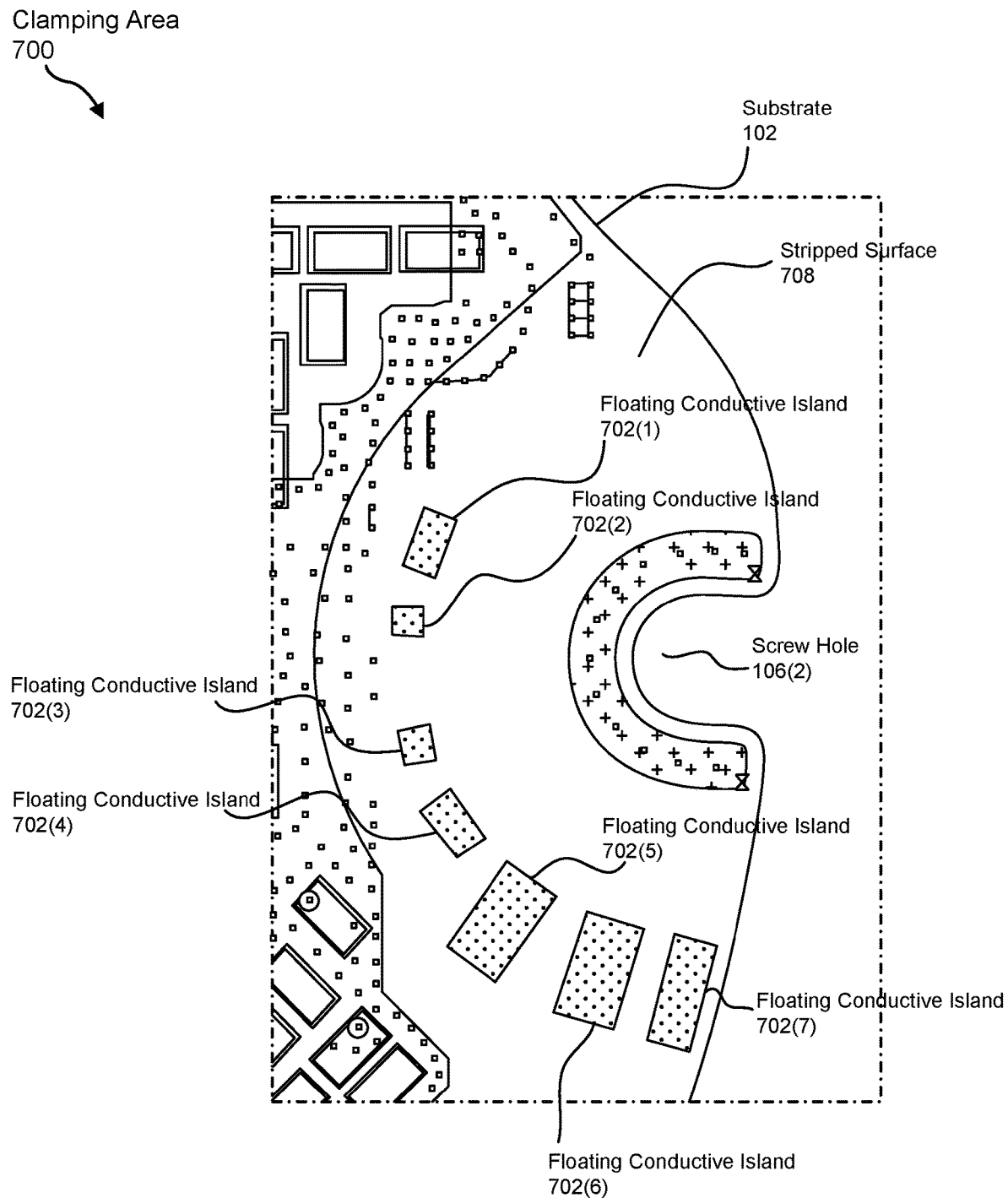
FIG. 7 is an illustration of an exemplary clamping area of a circuit package according to one or more embodiments of this disclosure.

FIG. 7 illustrates a portion of an exemplary clamping area 700 of a SIP capable of being mounted to a mobile device enclosure. In some examples, clamping area 700 may include and/or represent certain components, configurations, and/or features that perform and/or provide functionalities that are similar and/or identical to those described above in connection with any of FIGS. 1-6. As illustrated in FIG. 7, exemplary clamping area 700 may include and/or represent substrate 102 configured to be mounted, secured, and/or coupled to an enclosure of a mobile device by a screw. In one example, clamping area 700 may also include and/or represent floating conductive islands 702(1), 702(2), 702(3), 702(4), 702(5), 702(6), and 702(7), which are embedded in and/or formed from internal conductive layers of substrate 102.

In some examples, the screw may be inserted into and/or pass through screw hole 106(2) on substrate 102 to reach and/or mate with a receptacle on the enclosure. Additionally or alternatively, clamping area 700 may include and/or represent a mounting point at which the SIP mates with and/or makes contact with the mobile device enclosure.

In some examples, substrate 102 may include and/or incorporate a stripped surface 708 from which all conductive planes, layers, and/or materials have been removed. In one example, stripped surface 708 may include and/or represent an exterior and/or outer surface (e.g., a top or bottom surface) of substrate 102. In this example, stripped surface 708 may include and/or represent a keepout zone and/or region that mitigates and/or prevents antenna and/or RF interference for the SIP. In some implementations, the keepout zone and/or region may be reserved to maintain a certain metal-free clearance and/or distance between the antenna radiation element and the system ground. In such implementations, this metal-free clearance and/or distance may inform, influence, and/or determine the antenna tuning, impedance matching, and/or antenna bandwidth of the system.

In some examples, floating conductive islands 702(1)-(7) may each include and/or represent any type or form of isolated, internal segments and/or sections of an electrically conductive plane and/or layer within substrate 102. For example, floating conductive islands 702(1)-(7) may each include and/or represent isolated pieces of copper that reside and/or are disposed between insulation material within substrate 102. In this example, floating conductive islands 702(1)-(7) may maintain board thickness and/or flatness near screw hole 106(1) of substrate 102 to reinforce the structural integrity and/or robustness of the SIP near the clamping area and/or keepout region.

Figure 8:
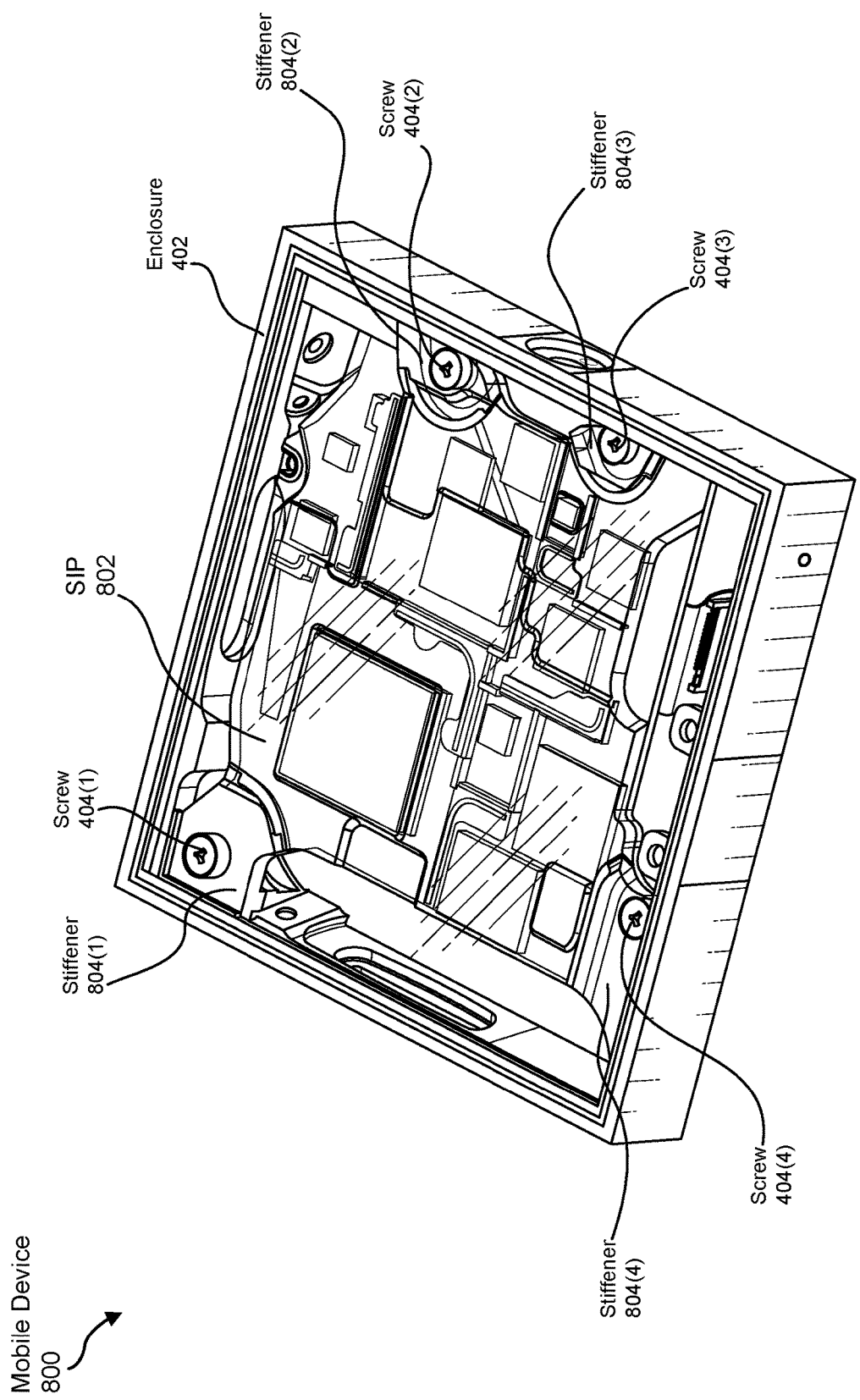
FIG. 8 is an illustration of an exemplary mobile device that includes a SIP with multipurpose screw holes according to one or more embodiments of this disclosure.

FIG. 8 illustrates a portion of an exemplary mobile device 800 that includes a SIP 802 coupled and/or mounted to enclosure 402. In some examples, mobile device 800 may include and/or represent certain components, configurations, and/or features that perform and/or provide functionalities that are similar and/or identical to those described above in connection with any of FIGS. 1-7. As illustrated in FIG. 8, exemplary mobile device 800 may include and/or represent SIP 802 mounted, secured, and/or coupled to enclosure 402 by screws 404(1), 404(2), 404(3), and 404(4). In one example, the mounting points at which SIP 802 is mounted, secured, and/or coupled to enclosure 402 may be reinforced and/or fortified by stiffeners 804(1), 804(2), 804(3), and 804(4).

In some examples, one or more of stiffeners 804(1)-(4) may be bonded, adhered, and/or coupled to substrate 102 of SIP 802 around and/or proximate to screws 404(1)-(4) and/or the corresponding screw holes. Additionally or alternatively, one or more of stiffeners 804(1)-(4) may be bonded, adhered, and/or coupled to enclosure 402 around and/or proximate to screws 404(1)-(4) and/or the corresponding screw holes. In one example, one or more of stiffeners 804(1)-(4) may include and/or contain RF-transparent material(s). In another example, one or more of stiffeners 804(1)-(4) may include and/or contain conductive material (e.g., metal) that supplements an RF grounding feature that electrically couples an RF ground on SIP 802 to an electrical ground on enclosure 402.

In some examples, mobile device 800 may include and/or represent any type or form of computing device configured for mobile operation and/or functionality by a user. Examples of mobile device 800 include, without limitation, watches, mobile phones, wearable devices, head-mounted displays, wristbands, neckbands, pendants, bracelets, rings, jewelry, anklebands, clothing, electronic textiles, shoes, clips, headsets, headbands, gloves, glasses, laptops, multimedia devices, gaming consoles, personal digital assistants, tablets, variations or combinations of one or more of the same, and/or any other suitable mobile device.

Figure 9A:
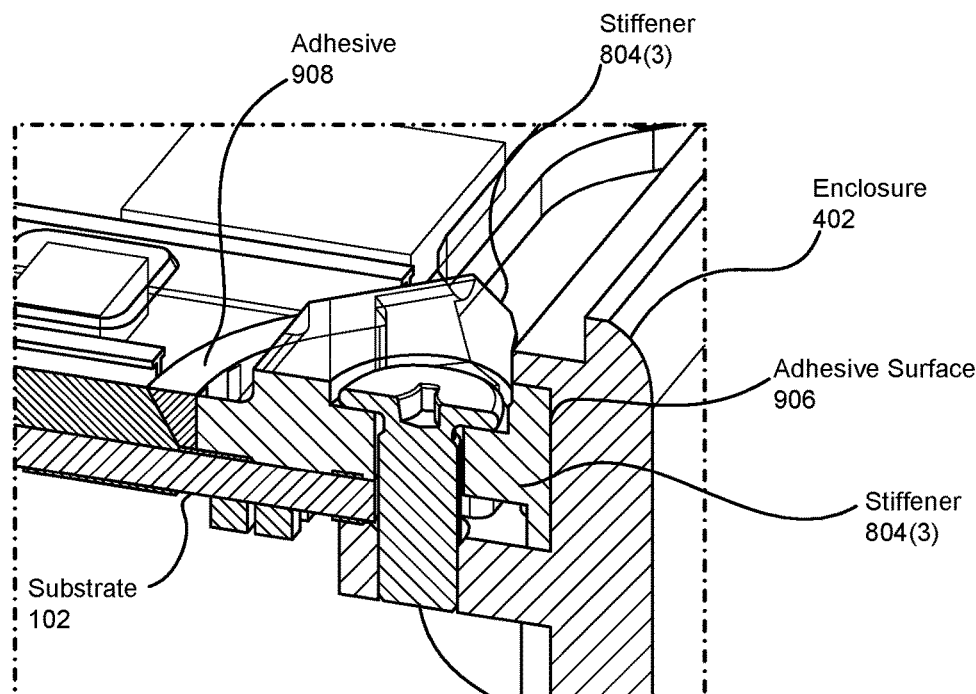
FIGS. 9A and 9B are illustrations of an exemplary clamping area of a circuit package according to certain embodiments of this disclosure.
Figure 9B:
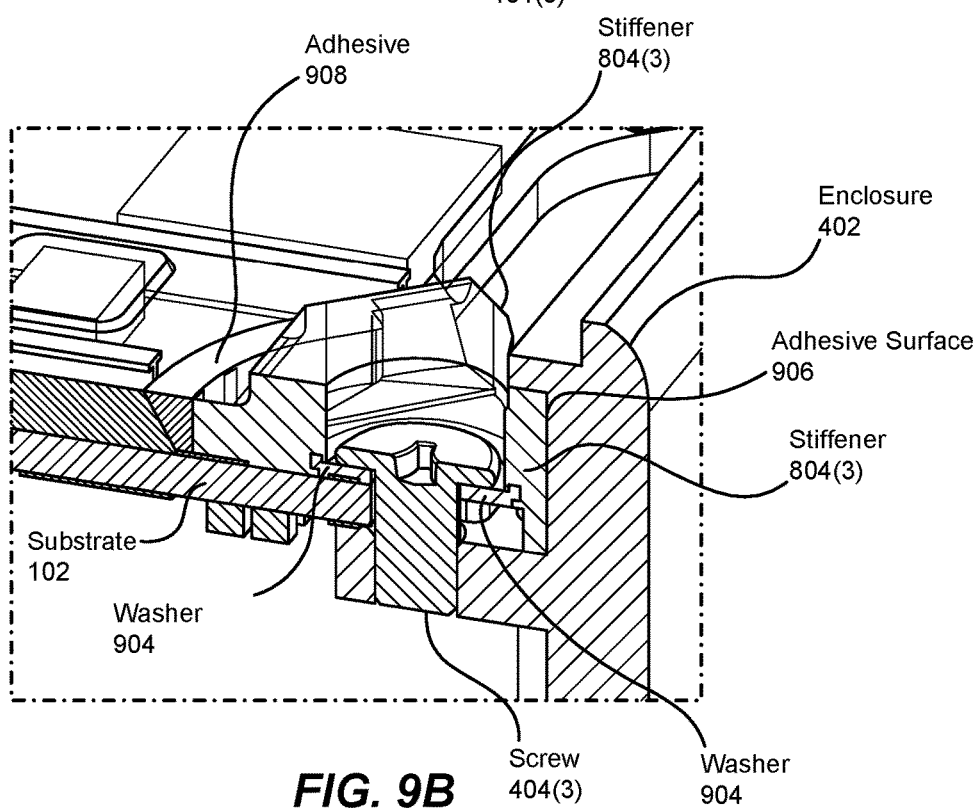

FIGS. 9A and 9B illustrate a portion of an exemplary clamping area 900 of a SIP mounted to enclosure 402 of a mobile device. In some examples, clamping area 900 may include and/or represent certain components, configurations, and/or features that perform and/or provide functionalities that are similar and/or identical to those described above in connection with any of FIGS. 1-8. As illustrated in FIGS. 9A and 9B, exemplary clamping area 900 may include and/or represent substrate 102 mounted, secured, and/or coupled to enclosure 402 of the mobile device by screw 404(3). In one example, clamping area 900 may also include and/or represent stiffener 804(3) bonded, adhered, and/or coupled to both substrate 102 and adhesive surface 906 of enclosure 402 by adhesive 908 (e.g., a glue and/or silicone).

In some examples, and as illustrated in FIG. 9A, clamping area 900 may exclude and/or omit a washer between the head of screw 404(3) and stiffener 804(3). In other examples, and as illustrated in FIG. 9B, clamping area 900 may include and/or incorporate a stiffening washer 904 that resides and/or is placed between the head of screw 404(3) and stiffener 804(3). In one example, washer 904 may include and/or represent a plated and/or unplated stainless steel (e.g., SS316L) washer that improves and/or bolsters surface contact reliability (e.g., to preserve top side antenna contact).

In some examples, the various devices and systems described in connection with FIGS. 1-9B may include and/or represent one or more additional circuits, components, and/or features that are not necessarily illustrated and/or labeled in FIGS. 1-9B. For example, circuit package 100, SIP 200, and/or mobile device 800 may also include and/or represent additional analog and/or digital circuitry, onboard logic, transistors, antennas, resistors, capacitors, diodes, inductors, switches, registers, flipflops, connections, traces, buses, semiconductor (e.g., silicon) devices and/or structures, processing devices, storage devices, circuit boards, packages, substrates, housings, combinations or variations of one or more of the same, and/or any other suitable components that facilitate and/or support implementing multipurpose screw holes in circuit packaging for mobile devices. In certain implementations, one or more of these additional circuits, components, and/or features may be inserted and/or applied between any of the existing circuits, components, and/or features illustrated in FIGS. 1-9B consistent with the aims and/or objectives described herein. Accordingly, the electrical and/or communicative couplings described with reference to FIGS. 1-9B may be direct connections with no intermediate components, devices, and/or nodes or indirect connections with one or more intermediate components, devices, and/or nodes.

In some examples, the phrase "to couple" and/or the term "coupling", as used herein, may refer to a direct connection and/or an indirect connection. For example, a direct coupling between two components may constitute and/or represent a coupling in which those two components are directly connected to each other by a single node that provides electrical continuity from one of those two components to the other. In other words, the direct coupling may exclude and/or omit any additional components between those two components.

Additionally or alternatively, an indirect coupling between two components may constitute and/or represent a coupling in which those two components are indirectly connected to each other by multiple nodes that fail to provide electrical continuity from one of those two components to the other. In other words, the indirect coupling may include and/or incorporate at least one additional component between those two components.

Figure 10:
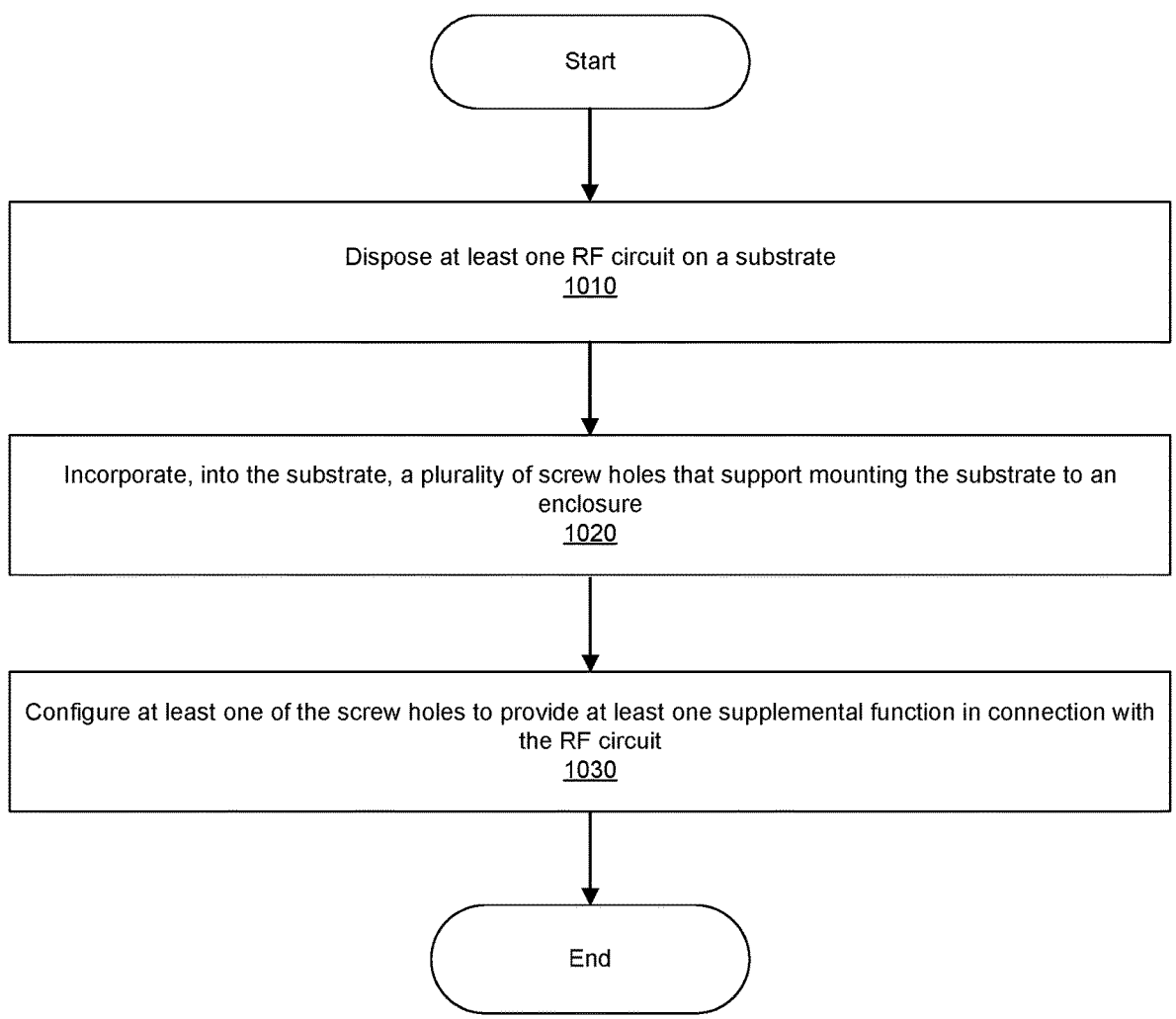
FIG. 10 is a flowchart of an exemplary method for implementing multipurpose screw holes in circuit packaging for mobile devices according to one or more embodiments of this disclosure.

FIG. 10 is a flow diagram of an exemplary method 1000 for implementing multipurpose screw holes in circuit packaging for mobile devices. In one example, the steps shown in FIG. 10 may be performed during the manufacture and/or assembly of a circuit package, a SIP, and/or a mobile device. Additionally or alternatively, the steps shown in FIG. 10 may incorporate and/or involve various sub-steps and/or variations consistent with one or more of the descriptions provided above in connection with FIGS. 1-9B.

As illustrated in FIG. 10, method 1000 may include and/or involve the step of disposing at least one RF circuit on a substrate (1010). Step 1010 may be performed in a variety of ways, including any of those described above in connection with FIGS. 1-9B. For example, a mobile device manufacturer or subcontractor may dispose at least one RF circuit on a substrate. In this example, the mobile device manufacturer or subcontractor may solder the RF circuit to the substrate.

In some examples, method 1000 may also include the step of incorporating, into the substrate, a plurality of screw holes that support mounting the substrate to an enclosure (1020). Step 1020 may be performed in a variety of ways, including any of those described above in connection with FIGS. 1-9B. For example, the mobile device manufacturer or subcontractor may incorporate, create, and/or form a plurality of screw holes into the substrate. In this example, the screw holes may support and/or facilitate mounting the substrate to an enclosure of a mobile device.

In some examples, method 1000 may also include the step of configuring at least one of the screw holes to provide at least one supplemental function in connection with the RF circuit (1030). Step 1030 may be performed in a variety of ways, including any of those described above in connection with FIGS. 1-9B. For example, the mobile device manufacturer or subcontractor may configure and/or arrange at least one of the screw holes to provide at least one supplemental function in connection with the RF circuit. Examples of such a supplemental function include, without limitation, strengthening mounting points of a SIP that includes the RF circuit, electrically grounding the RF circuit disposed on a SIP to the enclosure, repurposing the screw hole as an antenna feeding point for the RF circuit, repurposing the screw hole as an antenna tuning point for the RF circuit, combinations or variations of one or more of the same, and/or any other suitable supplemental function.

EXAMPLE EMBODIMENTS

Example 1: A circuit package comprising (1) a substrate, (2) at least one radio frequency (RF) circuit disposed on the substrate, and (3) a plurality of screw holes that are incorporated into the substrate and configured to support mounting the substrate to an enclosure, wherein at least one of the screw holes is further configured to provide at least one supplemental function in connection with the RF circuit.

Example 2: The circuit package of Example 1, further comprising a system in package (SIP) board that incorporates the substrate, the RF circuit, and the plurality of screw holes.

Example 3: The circuit package of either Example 1 or Example 2, wherein the supplemental function comprises an RF grounding feature that electrically couples an electrical ground of the RF circuit to an electrical ground of the enclosure.

Example 4: The circuit package of any of Examples 1-3, wherein the RF grounding feature comprises a conductive ring that (1) at least partially surrounds the screw hole, (2) is electrically coupled to the electrical ground of the RF circuit, and (3) is disposed on a surface of the substrate that makes contact with the electrical ground of the enclosure.

Example 5: The circuit package of any of Examples 1-4, wherein the RF grounding feature comprises an additional conductive ring that (1) at least partially surrounds the screw hole, (2) is electrically coupled to the electrical ground of the RF circuit, and (3) is disposed on a surface of the substrate that makes contact with a head of a screw that (A) at least partially secures the substrate to the enclosure and (B)

facilitates electrical continuity between the additional conductive ring and the electrical ground of the enclosure.

Example 6: The circuit package of any of Examples 1-5, wherein further comprising a stiffener that is bonded to the substrate proximate to the screw holes and includes at least one metal that supplements RF grounding feature.

Example 7: The circuit package of any of Examples 1-6, further comprising an antenna structure electrically coupled to the RF circuit, and wherein the supplemental function comprises an antenna feeding point of the antenna structure, the antenna feeding point being electrically coupled to a component of the RF circuit via a transmission line.

Example 8: The circuit package of any of Examples 1-7, further comprising at least one conductive ring that (1) at least partially surrounds the screw hole and (2) is electrically coupled to the antenna feeding point of the antenna structure.

Example 9: The circuit package of any of Examples 1-8, wherein the component of the RF circuit comprises at least one of a radio and/or an antenna port.

Example 10: The circuit package of any of Examples 1-9, further comprising an antenna structure electrically coupled to the RF circuit, and wherein the supplemental function comprises an antenna tuning point of the antenna structure, the antenna tuning point being electrically coupled to an antenna tuner port of the RF circuit via a transmission line.

Example 11: The circuit package of any of Examples 1-10, further comprising at least one conductive ring that (1) at least partially surrounds the screw hole and (2) is electrically coupled to the antenna tuning point of the antenna structure.

Example 12: The circuit package of any of Examples 1-11, further comprising a stiffener that is bonded to the substrate proximate to the screw holes and includes at least one RF-transparent material.

Example 13: The circuit package of any of Examples 1-12, wherein the substrate comprises (1) a plurality of external surfaces, (2) a plurality of conductive layers disposed on the external surfaces, and (3) a clamping area that at least partially surrounds the screw hole and in which the conductive layers are removed from the external surfaces.

Example 14: The circuit package of any of Examples 1-13, wherein the substrate comprises (1) an internal plane, (2) an additional conductive layer disposed on the internal plane, and/or (3) one or more floating conductive islands formed in the additional conductive layer within the clamping area.

Example 15: A mobile device comprising (1) an enclosure and (2) a circuit package comprising (A) a substrate, (B) at least one radio frequency (RF) circuit disposed on the substrate, and/or (C) a plurality of screw holes that are incorporated into the substrate and configured to support mounting the substrate to an enclosure, wherein at least one of the screw holes is further configured to provide at least one supplemental function in connection with the RF circuit.

Example 16: The mobile device of Example 15, wherein the circuit package comprises a system in package (SIP) board that incorporates the substrate, the RF circuit, and the plurality of screw holes.

Example 17: The mobile device of either Example 15 or Example 16, wherein the supplemental function comprises an RF grounding feature that electrically couples an electrical ground of the RF circuit to an electrical ground of the enclosure.

Example 18: The mobile device of any of Examples 15-17, wherein the RF grounding feature comprises a conductive ring that (1) at least partially surrounds the screw hole, (2) is electrically coupled to the electrical ground of the RF circuit, and/or (3) is disposed on a surface of the substrate that makes contact with the electrical ground of the enclosure.

Example 19: The mobile device of any of Examples 15-18, wherein the RF grounding feature comprises an additional conductive ring that (1) at least partially surrounds the screw hole, (2) is electrically coupled to the electrical ground of the RF circuit, and (3) is disposed on a surface of the substrate that makes contact with a head of a screw that (A) at least partially secures the substrate to the enclosure and (B) facilitates electrical continuity between the additional conductive ring and the electrical ground of the enclosure.

Example 20: A method comprising (1) disposing at least one radio frequency (RF) circuit on a substrate, (2) incorporating, into the substrate, a plurality of screw holes that support mounting the substrate to an enclosure, and/or (3) configuring at least one of the screw holes to provide at least one supplemental function in connection with the RF circuit.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 1100 in FIG. 11) or that visually immerses a user in an artificial reality (such as, e.g., virtual-reality system 1200 in FIG. 12). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 11:
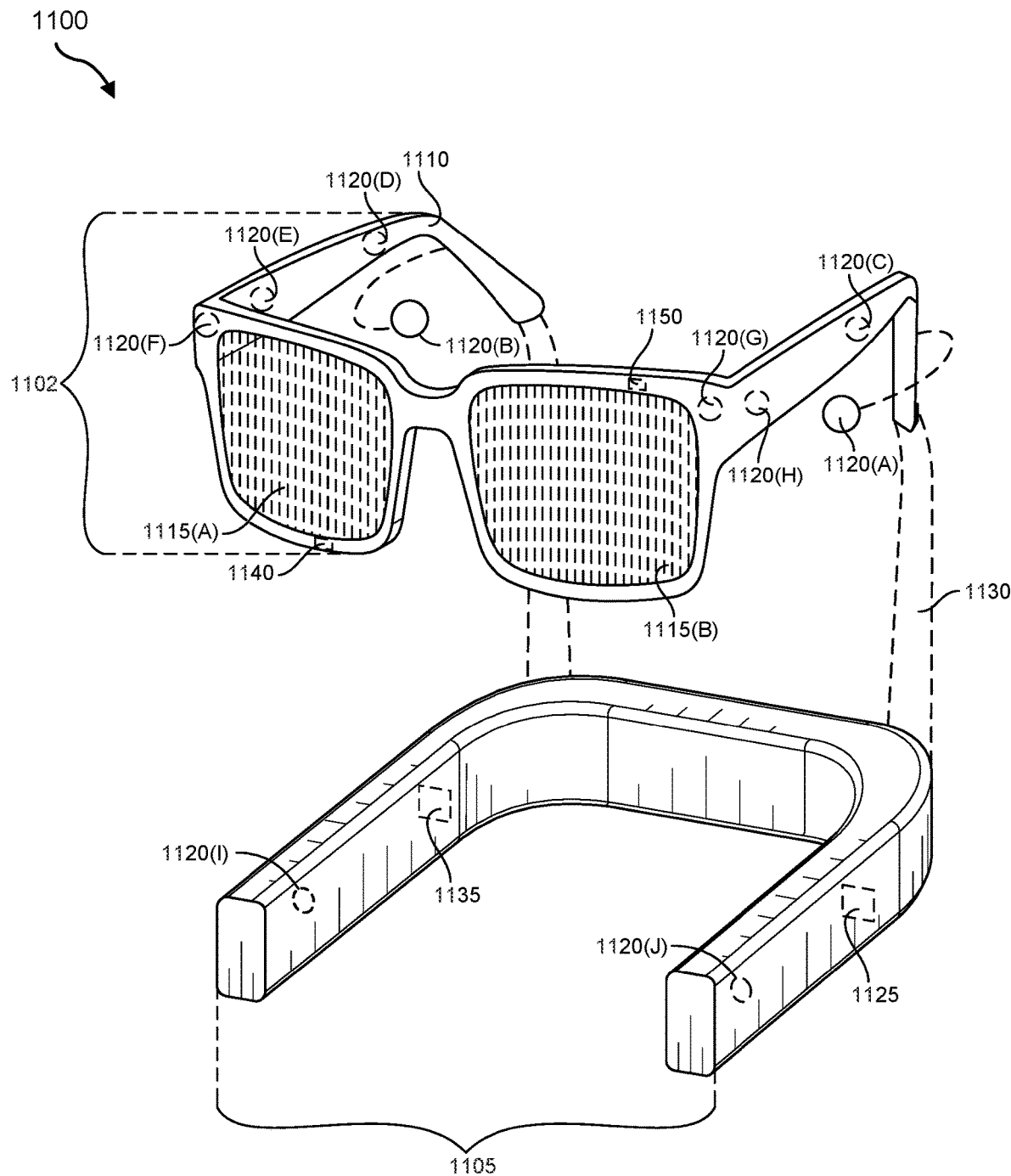
FIG. 11 is an illustration of exemplary augmented-reality system that may be used in connection with embodiments of this disclosure.

Turning to FIG. 11, augmented-reality system 1100 may include an eyewear device 1102 with a frame 1110 configured to hold a left display device 1115(A) and a right display device 1115(B) in front of a user's eyes. Display devices 1115(A) and 1115(B) may act together or independently to present an image or series of images to a user. While augmented-reality system 1100 includes two displays, embodiments of this disclosure may be implemented in augmented-reality systems with a single NED or more than two NEDs.

In some embodiments, augmented-reality system 1100 may include one or more sensors, such as sensor 1140.

Sensor 1140 may generate measurement signals in response to motion of augmented-reality system 1100 and may be located on substantially any portion of frame 1110. Sensor 1140 may represent one or more of a variety of different sensing mechanisms, such as a position sensor, an inertial measurement unit (IMU), a depth camera assembly, a structured light emitter and/or detector, or any combination thereof. In some embodiments, augmented-reality system 1100 may or may not include sensor 1140 or may include more than one sensor. In embodiments in which sensor 1140 includes an IMU, the IMU may generate calibration data based on measurement signals from sensor 1140. Examples of sensor 1140 may include, without limitation, accelerometers, gyroscopes, magnetometers, other suitable types of sensors that detect motion, sensors used for error correction of the IMU, or some combination thereof.

In some examples, augmented-reality system 1100 may also include a microphone array with a plurality of acoustic transducers 1120(A)-1120(J), referred to collectively as acoustic transducers 1120. Acoustic transducers 1120 may represent transducers that detect air pressure variations induced by sound waves. Each acoustic transducer 1120 may be configured to detect sound and convert the detected sound into an electronic format (e.g., an analog or digital format). The microphone array in FIG. 11 may include, for example, ten acoustic transducers: 1120(A) and 1120(B), which may be designed to be placed inside a corresponding ear of the user, acoustic transducers 1120(C), 1120(D), 1120(E), 1120(F), 1120(G), and 1120(H), which may be positioned at various locations on frame 1110, and/or acoustic transducers 1120(I) and 1120(J), which may be positioned on a corresponding neckband 1105.

In some embodiments, one or more of acoustic transducers 1120(A)-(J) may be used as output transducers (e.g., speakers). For example, acoustic transducers 1120(A) and/or 1120(B) may be earbuds or any other suitable type of headphone or speaker.

The configuration of acoustic transducers 1120 of the microphone array may vary. While augmented-reality system 1100 is shown in FIG. 11 as having ten acoustic transducers 1120, the number of acoustic transducers 1120 may be greater or less than ten. In some embodiments, using higher numbers of acoustic transducers 1120 may increase the amount of audio information collected and/or the sensitivity and accuracy of the audio information. In contrast, using a lower number of acoustic transducers 1120 may decrease the computing power required by an associated controller 1150 to process the collected audio information. In addition, the position of each acoustic transducer 1120 of the microphone array may vary. For example, the position of an acoustic transducer 1120 may include a defined position on the user, a defined coordinate on frame 1110, an orientation associated with each acoustic transducer 1120, or some combination thereof.

Acoustic transducers 1120(A) and 1120(B) may be positioned on different parts of the user's ear, such as behind the pinna, behind the tragus, and/or within the auricle or fossa. Or, there may be additional acoustic transducers 1120 on or surrounding the ear in addition to acoustic transducers 1120 inside the ear canal. Having an acoustic transducer 1120 positioned next to an ear canal of a user may enable the microphone array to collect information on how sounds arrive at the ear canal. By positioning at least two of acoustic transducers 1120 on either side of a user's head (e.g., as binaural microphones), augmented-reality system 1100 may simulate binaural hearing and capture a 3D stereo sound field around about a user's head. In some embodiments, acoustic transducers 1120(A) and 1120(B) may be connected to augmented-reality system 1100 via a wired connection 1130, and in other embodiments acoustic transducers 1120(A) and 1120(B) may be connected to augmented-reality system 1100 via a wireless connection (e.g., a BLUETOOTH connection). In still other embodiments, acoustic transducers 1120(A) and 1120(B) may not be used at all in conjunction with augmented-reality system 1100.

Acoustic transducers 1120 on frame 1110 may be positioned in a variety of different ways, including along the length of the temples, across the bridge, above or below display devices 1115(A) and 1115(B), or some combination thereof. Acoustic transducers 1120 may also be oriented such that the microphone array is able to detect sounds in a wide range of directions surrounding the user wearing the augmented-reality system 1100. In some embodiments, an optimization process may be performed during manufacturing of augmented-reality system 1100 to determine relative positioning of each acoustic transducer 1120 in the microphone array.

In some examples, augmented-reality system 1100 may include or be connected to an external device (e.g., a paired device), such as neckband 1105. Neckband 1105 generally represents any type or form of paired device. Thus, the following discussion of neckband 1105 may also apply to various other paired devices, such as charging cases, smart watches, smart phones, wrist bands, other wearable devices, hand-held controllers, tablet computers, laptop computers, other external compute devices, etc.

As shown, neckband 1105 may be coupled to eyewear device 1102 via one or more connectors. The connectors may be wired or wireless and may include electrical and/or non-electrical (e.g., structural) components. In some cases, eyewear device 1102 and neckband 1105 may operate independently without any wired or wireless connection between them. While FIG. 11 illustrates the components of eyewear device 1102 and neckband 1105 in example locations on eyewear device 1102 and neckband 1105, the components may be located elsewhere and/or distributed differently on eyewear device 1102 and/or neckband 1105. In some embodiments, the components of eyewear device 1102 and neckband 1105 may be located on one or more additional peripheral devices paired with eyewear device 1102, neckband 1105, or some combination thereof.

Pairing external devices, such as neckband 1105, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1100 may be provided by a paired device or shared between a paired device and an eyewear device, thus reducing the weight, heat profile, and form factor of the eyewear device overall while still retaining desired functionality. For example, neckband 1105 may allow components that would otherwise be included on an eyewear device to be included in neckband 1105 since users may tolerate a heavier weight load on their shoulders than they would tolerate on their heads. Neckband 1105 may also have a larger surface area over which to diffuse and disperse heat to the ambient environment. Thus, neckband 1105 may allow for greater battery and computation capacity than might otherwise have been possible on a stand-alone eyewear device. Since weight carried in neckband 1105 may be less invasive to a user than weight carried in eyewear device 1102, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1105 may be communicatively coupled with eyewear device 1102 and/or to other devices. These other devices may provide certain functions (e.g., tracking, localizing, depth mapping, processing, storage, etc.) to augmented-reality system 1100. In the embodiment of FIG. 11, neckband 1105 may include two acoustic transducers (e.g., 1120(I) and 1120(J)) that are part of the microphone array (or potentially form their own microphone subarray). Neckband 1105 may also include a controller 1125 and a power source 1135.

Acoustic transducers 1120(I) and 1120(J) of neckband 1105 may be configured to detect sound and convert the detected sound into an electronic format (analog or digital). In the embodiment of FIG. 11, acoustic transducers 1120(I) and 1120(J) may be positioned on neckband 1105, thereby increasing the distance between the neckband acoustic transducers 1120(I) and 1120(J) and other acoustic transducers 1120 positioned on eyewear device 1102. In some cases, increasing the distance between acoustic transducers 1120 of the microphone array may improve the accuracy of beamforming performed via the microphone array. For example, if a sound is detected by acoustic transducers 1120(C) and 1120(D) and the distance between acoustic transducers 1120(C) and 1120(D) is greater than, e.g., the distance between acoustic transducers 1120(D) and 1120(E), the determined source location of the detected sound may be more accurate than if the sound had been detected by acoustic transducers 1120(D) and 1120(E).

Controller 1125 of neckband 1105 may process information generated by the sensors on neckband 1105 and/or augmented-reality system 1100. For example, controller 1125 may process information from the microphone array that describes sounds detected by the microphone array. For each detected sound, controller 1125 may perform a direction-of-arrival (DOA) estimation to estimate a direction from which the detected sound arrived at the microphone array. As the microphone array detects sounds, controller 1125 may populate an audio data set with the information. In embodiments in which augmented-reality system 1100 includes an inertial measurement unit, controller 1125 may compute all inertial and spatial calculations from the IMU located on eyewear device 1102. A connector may convey information between augmented-reality system 1100 and neckband 1105 and between augmented-reality system 1100 and controller 1125. The information may be in the form of optical data, electrical data, wireless data, or any other transmittable data form. Moving the processing of information generated by augmented-reality system 1100 to neckband 1105 may reduce weight and heat in eyewear device 1102, making it more comfortable to the user.

Power source 1135 in neckband 1105 may provide power to eyewear device 1102 and/or to neckband 1105. Power source 1135 may include, without limitation, lithium ion batteries, lithium-polymer batteries, primary lithium batteries, alkaline batteries, or any other form of power storage. In some cases, power source 1135 may be a wired power source. Including power source 1135 on neckband 1105 instead of on eyewear device 1102 may help better distribute the weight and heat generated by power source 1135.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1200 in FIG. 12, that mostly or completely covers a user's field of view. Virtual-reality system 1200 may include a front rigid body 1202 and a band 1204 shaped to fit around a user's head. Virtual-reality system 1200 may also include output audio transducers 1206(A) and 1206(B). Furthermore, while not shown in FIG. 12, front rigid body 1202 may include one or more electronic elements, including one or more electronic displays, one or more inertial measurement units (IMUs), one or more tracking emitters or detectors, and/or any other suitable device or system for creating an artificial-reality experience.

Artificial-reality systems may include a variety of types of visual feedback mechanisms. For example, display devices in augmented-reality system 1100 and/or virtual-reality system 1200 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 1100 and/or virtual-reality system 1200 may include microLED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 1100 and/or virtual-reality system 1200 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

As noted, artificial-reality systems 1100 and 1200 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 13:
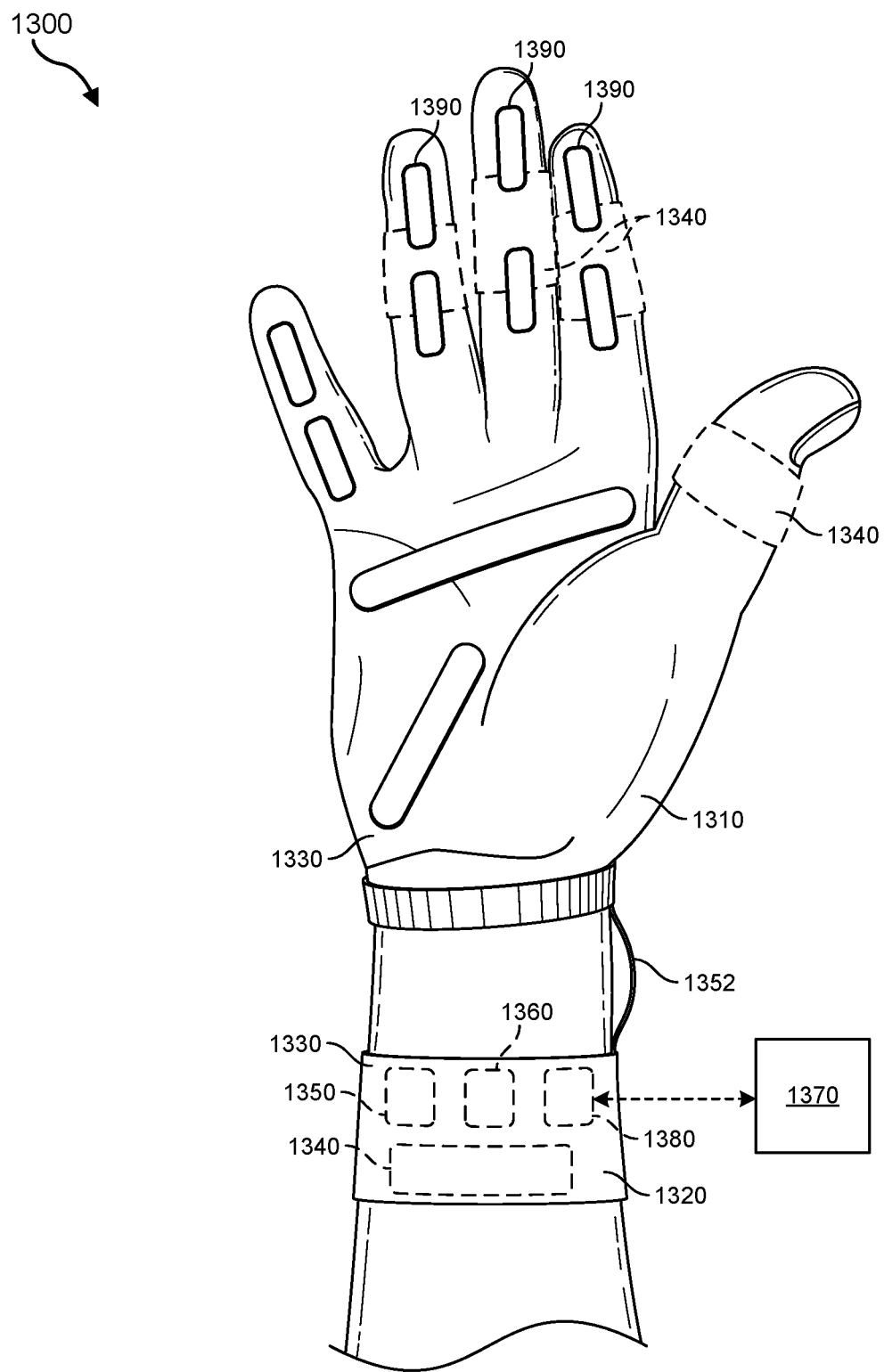
FIG. 13 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 13 illustrates a vibrotactile system 1300 in the form of a wearable glove (haptic device 1310) and wristband (haptic device 1320). Haptic device 1310 and haptic device 1320 are shown as examples of wearable devices that include a flexible, wearable textile material 1330 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1340 may be positioned at least partially within one or more corresponding pockets formed in textile material 1330 of vibrotactile system 1300. Vibrotactile devices 1340 may be positioned in locations to provide a vibrating sensation (e.g., haptic feedback) to a user of vibrotactile system 1300. For example, vibrotactile devices 1340 may be positioned against the user's finger(s), thumb, or wrist, as shown in FIG. 13. Vibrotactile devices 1340 may, in some examples, be sufficiently flexible to conform to or bend with the user's corresponding body part(s).

A power source 1350 (e.g., a battery) for applying a voltage to the vibrotactile devices 1340 for activation thereof may be electrically coupled to vibrotactile devices 1340, such as via conductive wiring 1352. In some examples, each of vibrotactile devices 1340 may be independently electrically coupled to power source 1350 for individual activation. In some embodiments, a processor 1360 may be operatively coupled to power source 1350 and configured (e.g., programmed) to control activation of vibrotactile devices 1340.

Vibrotactile system 1300 may be implemented in a variety of ways. In some examples, vibrotactile system 1300 may be a standalone system with integral subsystems and components for operation independent of other devices and systems. As another example, vibrotactile system 1300 may be configured for interaction with another device or system 1370. For example, vibrotactile system 1300 may, in some examples, include a communications interface 1380 for receiving and/or sending signals to the other device or system 1370. The other device or system 1370 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1380 may enable communications between vibrotactile system 1300 and the other device or system 1370 via a wireless (e.g., Wi-Fi, BLUETOOTH, cellular, radio, etc.) link or a wired link. If present, communications interface 1380 may be in communication with processor 1360, such as to provide a signal to processor 1360 to activate or deactivate one or more of the vibrotactile devices 1340.

Vibrotactile system 1300 may optionally include other subsystems and components, such as touch-sensitive pads 1390, pressure sensors, motion sensors, position sensors, lighting elements, and/or user interface elements (e.g., an on/off button, a vibration control element, etc.). During use, vibrotactile devices 1340 may be configured to be activated for a variety of different reasons, such as in response to the user's interaction with user interface elements, a signal from the motion or position sensors, a signal from the touch-sensitive pads 1390, a signal from the pressure sensors, a signal from the other device or system 1370, etc.

Although power source 1350, processor 1360, and communications interface 1380 are illustrated in FIG. 13 as being positioned in haptic device 1320, the present disclosure is not so limited. For example, one or more of power source 1350, processor 1360, or communications interface 1380 may be positioned within haptic device 1310 or within another wearable textile.

Figure 14:
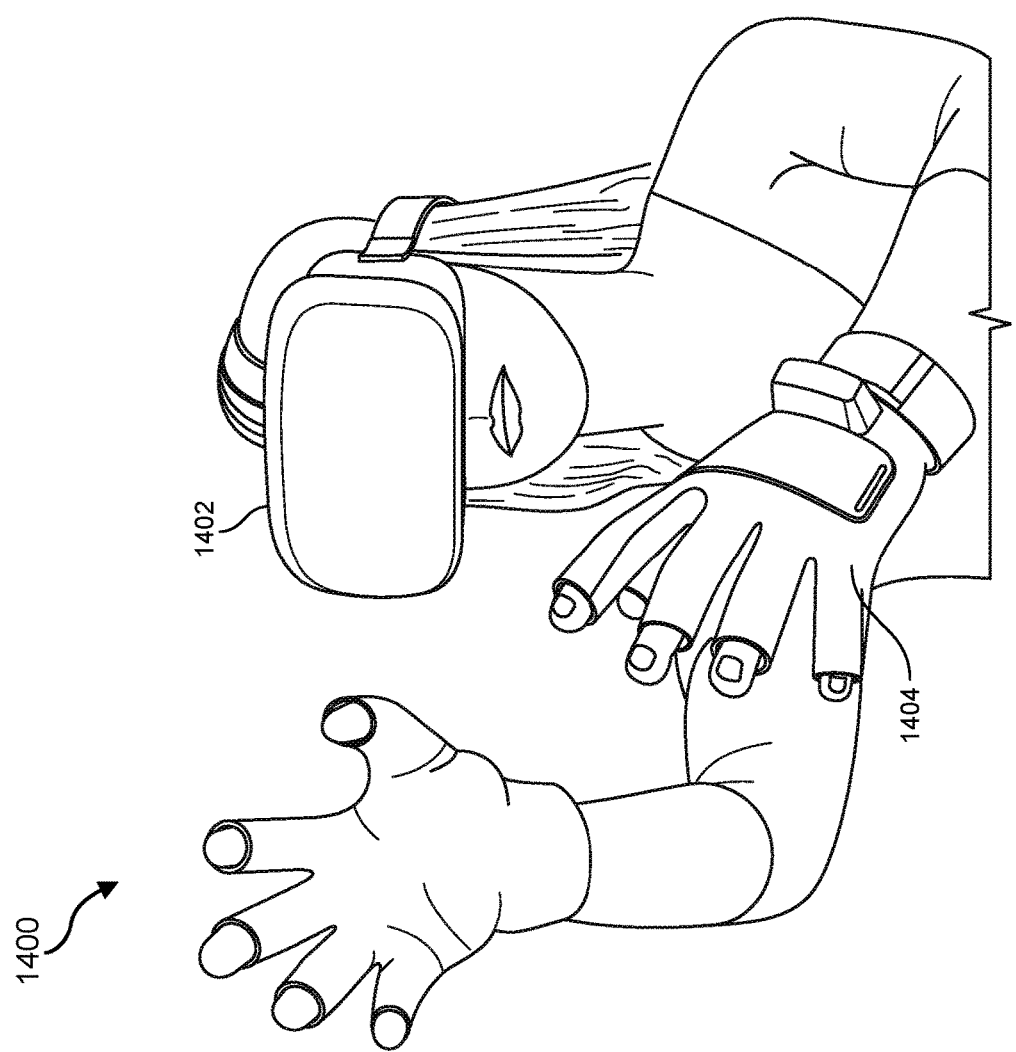
FIG. 14 is an illustration of an exemplary virtual-reality environment according to embodiments of this disclosure.

Haptic wearables, such as those shown in and described in connection with FIG. 13, may be implemented in a variety of types of artificial-reality systems and environments. FIG. 14 shows an example artificial-reality environment 1400 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 12:
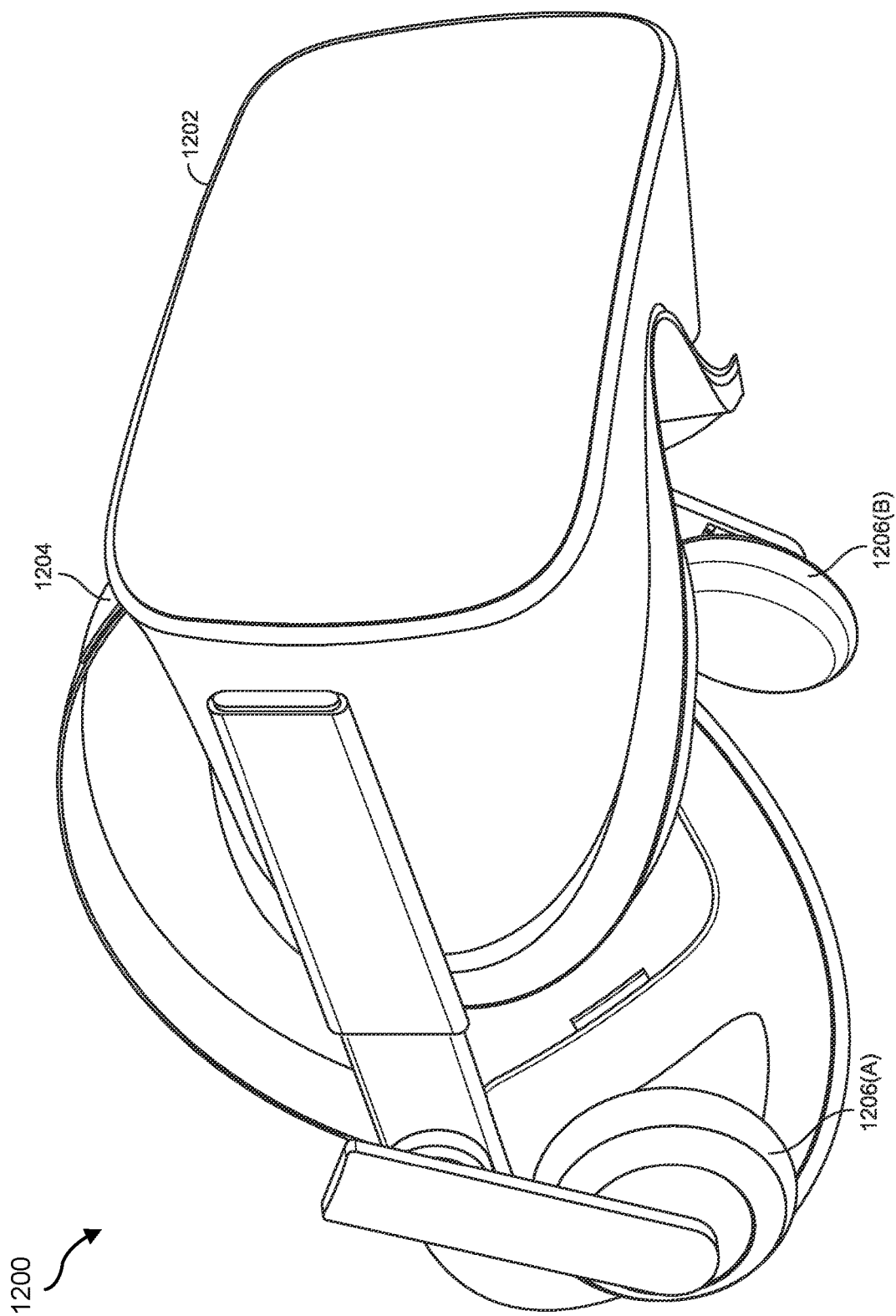
FIG. 12 is an illustration of an exemplary virtual-reality system that may be used in connection with embodiments of this disclosure.

Head-mounted display 1402 generally represents any type or form of virtual-reality system, such as virtual-reality system 1200 in FIG. 12. Haptic device 1404 generally represents any type or form of wearable device, worn by a user of an artificial-reality system, that provides haptic feedback to the user to give the user the perception that he or she is physically engaging with a virtual object. In some embodiments, haptic device 1404 may provide haptic feedback by applying vibration, motion, and/or force to the user. For example, haptic device 1404 may limit or augment a user's movement. To give a specific example, haptic device 1404 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 1404 to send action requests to a console. Examples of action requests include, without limitation, requests to start an application and/or end the application and/or requests to perform a particular action within the application.

Figure 15:
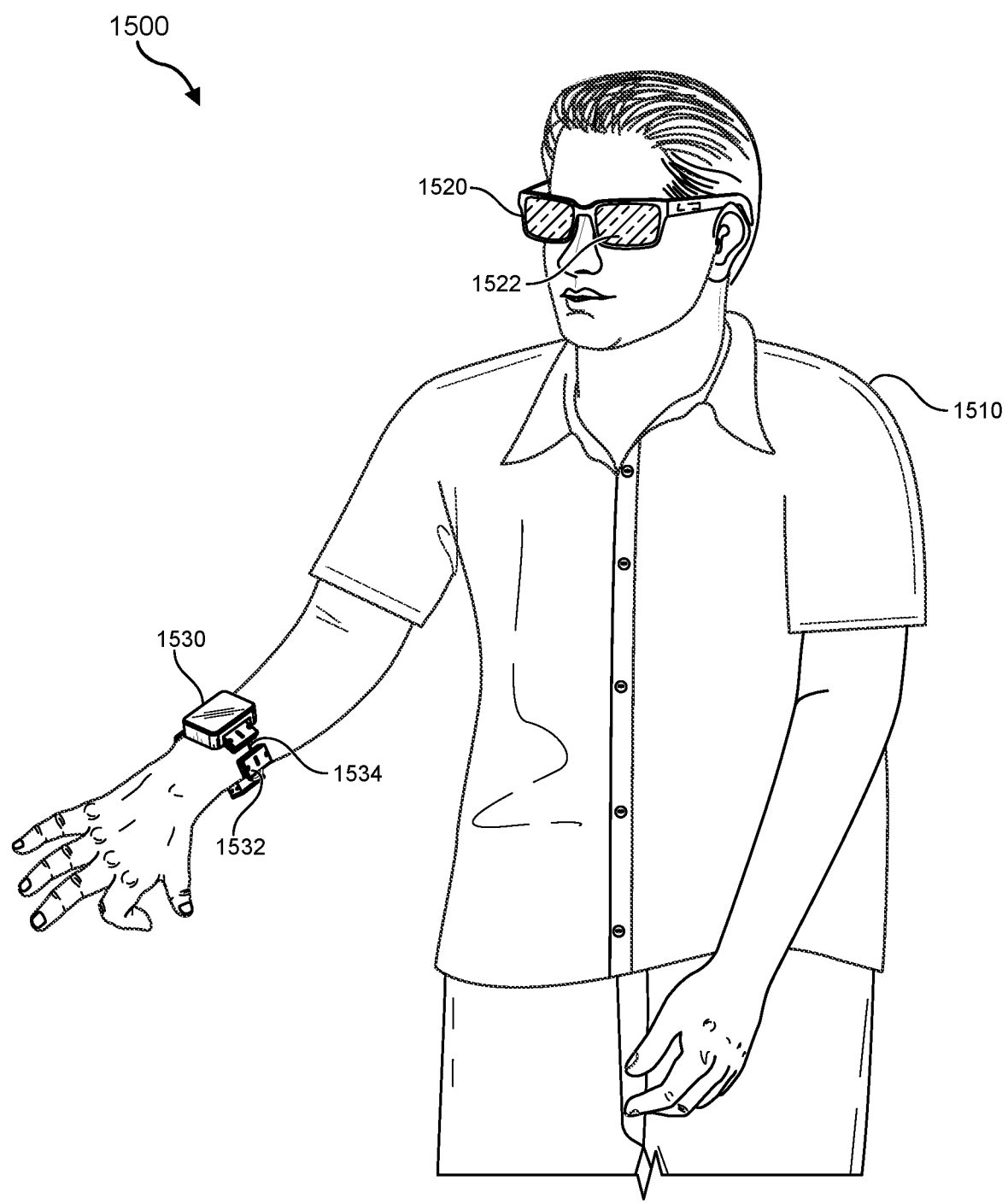
FIG. 15 is an illustration of an exemplary augmented-reality environment according to embodiments of this disclosure.

While haptic interfaces may be used with virtual-reality systems, as shown in FIG. 14, haptic interfaces may also be used with augmented-reality systems, as shown in FIG. 15. FIG. 15 is a perspective view of a user 1510 interacting with an augmented-reality system 1500. In this example, user 1510 may wear a pair of augmented-reality glasses 1520 that may have one or more displays 1522 and that are paired with a haptic device 1530. In this example, haptic device 1530 may be a wristband that includes a plurality of band elements 1532 and a tensioning mechanism 1534 that connects band elements 1532 to one another. Additionally or alternatively, haptic device 1530 may include and/or represent a haptic smartwatch and/or a smartwatch with haptic features.

One or more of band elements 1532 may include any type or form of actuator suitable for providing haptic feedback. For example, one or more of band elements 1532 may be configured to provide one or more of various types of cutaneous feedback, including vibration, force, traction, texture, and/or temperature. To provide such feedback, band elements 1532 may include one or more of various types of actuators. In one example, each of band elements 1532 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1310, 1320, 1404, and 1530 may include any suitable number and/or type of haptic transducer, sensor, and/or feedback mechanism. For example, haptic devices 1310, 1320, 1404, and 1530 may include one or more mechanical transducers, piezoelectric transducers, and/or fluidic transducers. Haptic devices 1310, 1320, 1404, and 1530 may also include various combinations of different types and forms of transducers that work together or independently to enhance a user's artificial-reality experience. In one example, each of band elements 1532 of haptic device 1530 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and may be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to any claims appended hereto and their equivalents in determining the scope of the present disclosure.

Unless otherwise noted, the terms "connected to" and "coupled to" (and their derivatives), as used in the specification and/or claims, are to be construed as permitting both direct and indirect (i.e., via other elements or components) connection. In addition, the terms "a" or "an," as used in the specification and/or claims, are to be construed as meaning "at least one of." Finally, for ease of use, the terms "including" and "having" (and their derivatives), as used in the specification and/or claims, are interchangeable with and have the same meaning as the word "comprising."

What is claimed is:

1. A circuit package comprising:
a substrate;
at least one radio frequency (RF) circuit disposed on the substrate; and
a plurality of screw holes that are incorporated into the substrate and configured to support mounting the substrate to an enclosure, wherein:
at least one of the screw holes is further configured to provide an RF grounding feature that electrically couples an electrical ground of the RF circuit to an electrical ground of the enclosure; and the RF grounding feature comprises a conductive ring that:
   at least partially surrounds the screw hole;
   is electrically coupled to the electrical ground of the RF circuit; and
   is disposed on a surface of the substrate that makes contact with the electrical ground of the enclosure.

2. The circuit package of claim 1, further comprising a system-in-package (SIP) board that incorporates the substrate, the RF circuit, and the plurality of screw holes.

3. The circuit package of claim 1, wherein the RF grounding feature comprises an additional conductive ring that:
   at least partially surrounds the screw hole;
   is electrically coupled to the electrical ground of the RF circuit; and
   is disposed on a surface of the substrate that makes contact with a head of a screw that:
      at least partially secures the substrate to the enclosure; and
      facilitates electrical continuity between the additional conductive ring and the electrical ground of the enclosure.

4. The circuit package of claim 1, wherein further comprising a stiffener that is bonded to the substrate proximate to the screw holes and includes at least one metal that supplements RF grounding feature.

5. The circuit package of claim 1, further comprising a stiffener that is bonded to the substrate proximate to the screw holes and includes at least one RF-transparent material.

6. The circuit package of claim 1, wherein the substrate comprises:
   a plurality of external surfaces;
   a plurality of conductive layers disposed on the external surfaces; and
   a clamping area that at least partially surrounds the screw hole and in which the conductive layers are removed from the external surfaces.

7. The circuit package of claim 6, wherein the substrate comprises:
   an internal plane;
   an additional conductive layer disposed on the internal plane; and
   one or more floating conductive islands formed in the additional conductive layer within the clamping area.

8. A circuit package comprising:
   a substrate;
   at least one radio frequency (RF) circuit disposed on the substrate; and
   a plurality of screw holes that are incorporated into the substrate and configured to support mounting the substrate to an enclosure, wherein at least one of the screw holes comprises an antenna feeding point of an antenna structure electrically coupled to the RF circuit.

9. The circuit package of claim 8, further comprising the antenna structure.

10. The circuit package of claim 8, further comprising at least one conductive ring that at least partially surrounds the screw hole and is electrically coupled to the antenna feeding point of the antenna structure.

11. The circuit package of claim 8, further comprising the enclosure.

12. The mobile device circuit package of claim 8, further comprising a system in package (SIP) board that incorporates the substrate, the RF circuit, and the plurality of screw holes17, wherein the RF grounding feature comprises an additional conductive ring that:
   at least partially surrounds the screw hole;
   is electrically coupled to the electrical ground of the RF circuit; and
   is disposed on a surface of the substrate that makes contact with a head of a screw that:
      at least partially secures the substrate to the enclosure; and
      facilitates electrical continuity between the additional conductive ring and the electrical ground of the enclosure.

13. The circuit package of claim 8, wherein the substrate comprises:
   a plurality of external surfaces;
   a plurality of conductive layers disposed on the external surfaces; and
   a clamping area that at least partially surrounds the screw hole and in which the conductive layers are removed from the external surfaces.

14. The circuit package of claim 13, wherein the substrate comprises:
   an internal plane;
   an additional conductive layer disposed on the internal plane; and
   one or more floating conductive islands formed in the additional conductive layer within the clamping area.

15. A circuit package comprising:
   a substrate;
   at least one radio frequency (RF) circuit disposed on the substrate;
   an antenna structure electrically coupled to the RF circuit; and
   a plurality of screw holes that are incorporated into the substrate and configured to support mounting the substrate to an enclosure, wherein at least one of the screw holes is electrically coupled to an antenna tuning point of the antenna structure.

16. The circuit package of claim 15, further comprising at least one conductive ring that at least partially surrounds the screw hole and is electrically coupled to the antenna tuning point of the antenna structure.

17. The circuit package of claim 15, wherein the substrate comprises:
   a plurality of external surfaces;
   a plurality of conductive layers disposed on the external surfaces; and
   a clamping area that at least partially surrounds the screw hole and in which the conductive layers are removed from the external surfaces.

18. The circuit package of claim 17, wherein the substrate comprises:
   an internal plane;
   an additional conductive layer disposed on the internal plane; and
   one or more floating conductive islands formed in the additional conductive layer within the clamping area.

19. The circuit package of claim 15, further comprising a system in package (SIP) board that incorporates the substrate, the RF circuit, and the plurality of screw holes.

* * * * *